(12) United States Patent
Oveis Gharan et al.

(10) Patent No.: US 11,463,105 B2
(45) Date of Patent: Oct. 4, 2022

(54) FORWARD ERROR CORRECTION CODING USING A TREE STRUCTURE

(71) Applicant: Ciena Corporation, Hanover, MD (US)

(72) Inventors: Shahab Oveis Gharan, Palo Alto, CA (US); Mohammad Ehsan Seifi, Ottawa (CA); Kim Roberts, Ottawa (CA)

(73) Assignee: CIENA CORPORATION, Hanover, MD (US)

( * ) Notice: Subject to any disclaimer, the term of this patent is extended or adjusted under 35 U.S.C. 154(b) by 0 days.

(21) Appl. No.: 17/425,396

(22) PCT Filed: Jun. 30, 2020

(86) PCT No.: PCT/IB2020/056183
§ 371 (c)(1),
(2) Date: Jul. 23, 2021

(87) PCT Pub. No.: WO2022/003396
PCT Pub. Date: Jan. 6, 2022

(65) Prior Publication Data
US 2022/0158657 A1 May 19, 2022

(51) Int. Cl.
*H03M 13/11* (2006.01)
*H03M 13/15* (2006.01)
(Continued)

(52) U.S. Cl.
CPC ...... *H03M 13/1111* (2013.01); *H03M 13/098* (2013.01); *H03M 13/136* (2013.01);
(Continued)

(58) Field of Classification Search
CPC ............ H03M 13/1111; H03M 13/098; H03M 13/136; H03M 13/1515; H03M 13/152; H03M 13/6516
See application file for complete search history.

(56) References Cited

U.S. PATENT DOCUMENTS 5,371,751 A 12/1994 Moriyama
6,990,624 B2 1/2006 Dohmen et al.
(Continued)

FOREIGN PATENT DOCUMENTS

EP 3148092 A1 3/2017

OTHER PUBLICATIONS

Arikan E., et al., "Channel Polarization: A Method for Constructing Capacity-Achieving Codes", ISIT 2008, Toronto, Canada, Jul. 6-11, 2008, 5 Pages.

(Continued)

*Primary Examiner* — Thien Nguyen
(74) *Attorney, Agent, or Firm* — Clements Bernard Baratta Walker; Lawrence A. Baratta, Jr.; Christopher L. Bernard

(57) ABSTRACT

A transmitter (200) generates (602) an encoded vector (404) by encoding (406) a data vector (402), the encoded vector representing payload information and parity information. The encoding is mathematically equivalent to calculating three or more forward error correction (FEC) codewords from the data vector and then calculating the encoded vector from the codewords, at least one codeword being calculated from at least one recursion of a mathematical operation, and at least one codeword comprising more than 6 terms. The transmitter transmits (604) a signal representing the encoded vector over a communication channel. A receiver (300) determines (702) a vector estimate (502) from the signal and recovers (716) the data vector from the vector estimate by sequentially decoding (706, 710, 714) the codewords, wherein at least one codeword that is decoded earlier in the decoding enhances an estimate of at least one codeword that is decoded later in the decoding.

20 Claims, 11 Drawing Sheets

(51) Int. Cl.
    *H03M 13/00*     (2006.01)
    *H03M 13/13*     (2006.01)
    *H03M 13/09*     (2006.01)

(52) U.S. Cl.
    CPC ..... *H03M 13/152* (2013.01); *H03M 13/1515* (2013.01); *H03M 13/6516* (2013.01)

(56) References Cited

U.S. PATENT DOCUMENTS

| | | | | |
|---|---|---|---|---|
| 10,367,600 | B2* | 7/2019 | Oveis Gharan ... | H03M 13/2948 |
| 10,615,913 | B2* | 4/2020 | Oveis Gharan ... | H03M 13/2906 |
| 11,070,312 | B1* | 7/2021 | Oveis Gharan ....... | H03M 13/13 |
| 2011/0043390 | A1* | 2/2011 | Yang ................. | H03M 13/2903 341/94 |
| 2011/0225475 | A1 | 9/2011 | Kumar et al. | |
| 2012/0008676 | A1 | 1/2012 | Lee et al. | |
| 2018/0367163 | A1* | 12/2018 | Saber ................. | H03M 13/616 |
| 2019/0043600 | A1* | 2/2019 | Saileshwar ......... | G06F 12/1408 |
| 2019/0158126 | A1 | 5/2019 | Carlough et al. | |
| 2020/0396021 | A1 | 12/2020 | Schnizler | |
| 2021/0182259 | A1* | 6/2021 | Erler .................. | G06F 16/2246 |
| 2021/0272327 | A1* | 9/2021 | Wang ........................ | G06T 1/60 |

OTHER PUBLICATIONS

Ido Tal et al., "List Decoding of Polar Codes", IEEE Transactions on Information Theory, vol. 61, No. 5, May 2015 (pp. 2213-2226).
International Search Report for PCT/IB2020/056183 dated Mar. 9, 2021.
Janvars T et al., "On decoding of multidimensional single parity turbo product codes", Proc. of Joint First Workshop on Mobile Future and Symposium on Trends in Communications 2003 (Sympotic '03), Oct. 26-28, 2003, Piscataway, NJ, USA, IEEE, pp. 25-28.
Leven A., et al., "Status and Recent Advances on Forward Error Correction Technologies for Lightwave Systems", Journal of Lightwave Technology, Aug. 15, 2014, vol. 32, Issue. 16, pp. 2735-2750.
Lin S., et al., "Error Control Coding", Second edition, Pearson, 2004, pp. 1-8.
Notice of Allowance for U.S. Appl. No. 16/916,282 dated Jun. 11, 2021.
Shu Lin et al., "Error Control Coding Fundamentals and Applications", Jan. 1, 1983, pp. 2, 51-62.
Written Opinion for PCT/IB2020/056183 dated Mar. 9, 2021.

* cited by examiner

FORWARD ERROR CORRECTION CODING USING A TREE STRUCTURE

TECHNICAL FIELD

This document relates to the technical field of communications.

BACKGROUND

In a communication network, a transmitter may transmit a signal over a communication channel to a receiver, where the signal is representative of digital information in the form of symbols or bits. The receiver may process the signal received over the communication channel to recover estimates of the symbols or bits. Various components of the communication network may contribute to signal degradation, such that the signal received at the receiver comprises a degraded version of the signal that was generated at the transmitter. In the case of an optical signal, degradation or distortion may be caused by polarization mode dispersion (PMD), polarization dependent loss or gain (PDL or PDG), state of polarization (SOP) rotation, amplified spontaneous emission (ASE), wavelength-dependent dispersion or chromatic dispersion (CD), and other effects. The degree of signal degradation may be characterized by a signal-to-noise ratio (SNR), or alternatively by a noise-to-signal ratio (NSR).

SUMMARY

According to a broad aspect, a transmitter device is configured to perform a method comprising generating an encoded vector by encoding a data vector representative of payload information, wherein the encoded vector is representative of the payload information and parity information dependent on the payload information, and wherein the encoding is mathematically equivalent to (i) calculating three or more forward error correction (FEC) codewords from the data vector and (ii) calculating the encoded vector from the codewords, at least one of the codewords being calculated from at least one recursion of a mathematical operation, and at least one of the codewords comprising more than 6 terms. The method further comprises transmitting a signal representative of the encoded vector over a communication channel.

According to some examples, the mathematical operation comprises Galois Field addition.

According to some examples, the mathematical operation comprises an exclusive OR operation.

According to some examples, the terms comprise bits or symbols.

According to some examples, each codeword belongs to one of a plurality of FEC codes comprising Bose, Chaudhuri, and Hocquenghem (BCH) codes, shortened binary BCH codes, Reed-Solomon (RS) codes, Reed-Muller codes, and repetition codes.

According to some examples, each codeword belongs to a systematic FEC code.

According to some examples, the transmitter is configured to calculate the encoded vector by applying a matrix to the data vector.

According to another broad aspect, a receiver device is configured to perform a method comprising determining, from a signal received at the receiver device over a communication channel, a vector estimate representative of payload information and parity information dependent on the payload information. The method further comprises generating a data vector representative of the payload information by decoding the vector estimate, wherein the decoding comprises calculating a first codeword estimate from the vector estimate using at least one recursion of a mathematical operation, decoding a first codeword from the first codeword estimate using a first FEC code, calculating a second codeword estimate using the vector estimate and the first codeword, decoding a second codeword from the second codeword estimate using a second FEC code, calculating a third codeword estimate using the vector estimate and one or both of the first codeword and the second codeword, decoding a third codeword from the third codeword estimate using a third FEC code, and calculating the data vector using a plurality of codewords comprising the first, second, and third codewords, wherein at least one of the plurality of codewords comprises more than 6 terms.

According to some examples, the mathematical operation comprises Galois Field addition.

According to some examples, the mathematical operation comprises an exclusive OR operation.

According to some examples, the terms comprise bits or symbols.

According to some examples, the FEC codes comprise any combination of BCH codes, shortened binary BCH codes, RS codes, Reed-Muller codes, and repetition codes.

According to some examples, the FEC codes comprise systematic codes.

According to some examples, the codeword estimates comprise confidence values, and wherein the first, second, and third codewords are decoded based, in part, on the confidence values.

DETAILED DESCRIPTION

Figure 1:
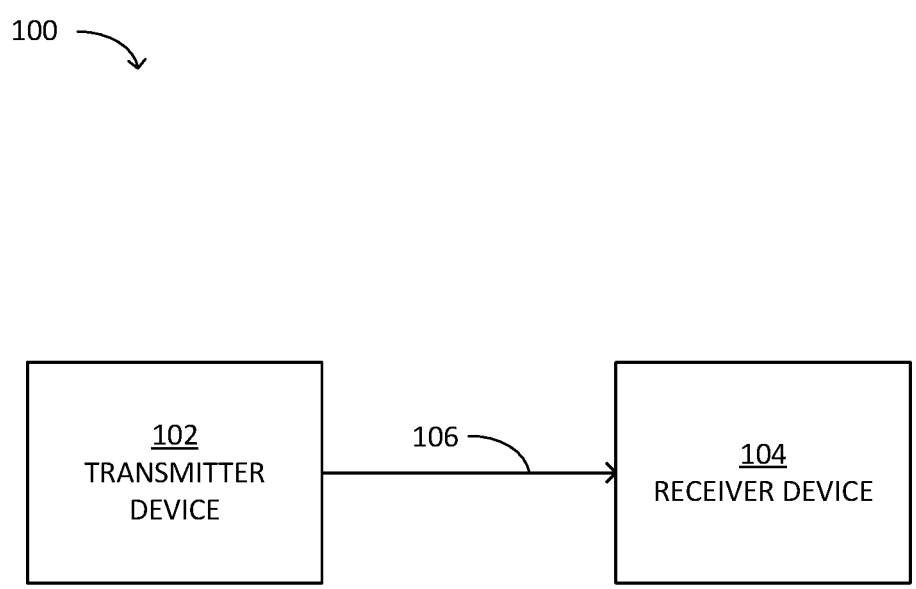
FIG. 1 illustrates an example communication network in accordance with some examples of the technology disclosed herein.

FIG. 1 illustrates an example communication network 100, in accordance with some examples of the technology disclosed herein.

The communication network 100 may comprise at least one transmitter device 102 and at least one receiver device 104, where the transmitter device 102 is capable of transmitting signals over a communication channel, such as a communication channel 106, and where the receiver device 104 is capable of receiving signals over a communication channel, such as the communication channel 106. According to some examples, the transmitter device 102 is also capable of receiving signals. According to some examples, the receiver device 104 is also capable of transmitting signals. Thus, one or both of the transmitter device 102 and the receiver device 104 may be capable of acting as a transceiver. According to one example, the transceiver may comprise a modem.

The communication network 100 may comprise additional elements not illustrated in FIG. 1. For example, the communication network 100 may comprise one or more additional transmitter devices, one or more additional receiver devices, and one or more other devices or elements involved in the communication of signals in the communication network 100.

According to some examples, the signals that are transmitted and received in the communication network 100 may comprise any combination of electrical signals, optical signals, and wireless signals. For example, the transmitter device 102 may comprise a first optical transceiver, the receiver device 104 may comprise a second optical transceiver, and the communication channel 106 may comprise an optical communication channel. According to one example, one or both of the first optical transceiver and the second optical transceiver may comprise a coherent modem.

Each optical communication channel in the communication network 100 may include one or more links, where each link may comprise one or more spans, and each span may comprise a length of optical fiber and one or more optical amplifiers.

Where the communication network 100 involves the transmission of optical signals, the communication network 100 may comprise additional optical elements not illustrated in FIG. 1, such as wavelength selective switches, optical multiplexers, optical de-multiplexers, optical filters, and the like.

Various elements and effects in the communication network 100 may result in the degradation of signals transmitted between different devices. Thus, a signal received at the receiver device 104 may comprise a degraded version of a signal transmitted by the transmitter device 102, where the degradation is caused by various impairments in the communication channel 106. For example, where the communication channel 106 is an optical communication channel, the signal transmitted by the transmitter device 102 may be degraded by polarization mode dispersion (PMD), polarization dependent loss or gain (PDL or PDG), state of polarization (SOP) rotation, amplified spontaneous emission (ASE) noise, and wavelength-dependent dispersion or chromatic dispersion (CD), nonlinear noise from propagation through fiber, and other effects. The degree of signal degradation may be characterized by a signal-to-noise ratio (SNR), or alternatively by a noise-to-signal ratio (NSR). The signals transmitted in the communication network 100 may be representative of digital information in the form of bits or symbols. The probability that bit estimates recovered at a receiver differ from the original bits encoded at a transmitter may be characterized by the Bit Error Ratio (BER). As the noise power increases relative to the signal power, the BER may also increase.

The receiver device 104 may receive a communication signal transmitted over a communication channel from the transmitter device 102, where the communication signal conveys symbols that are representative of digital information. At the receiver device 104, the decoded symbols that are recovered may comprise noisy versions of the symbols that were originally transmitted by the transmitter device 102.

Figure 2:
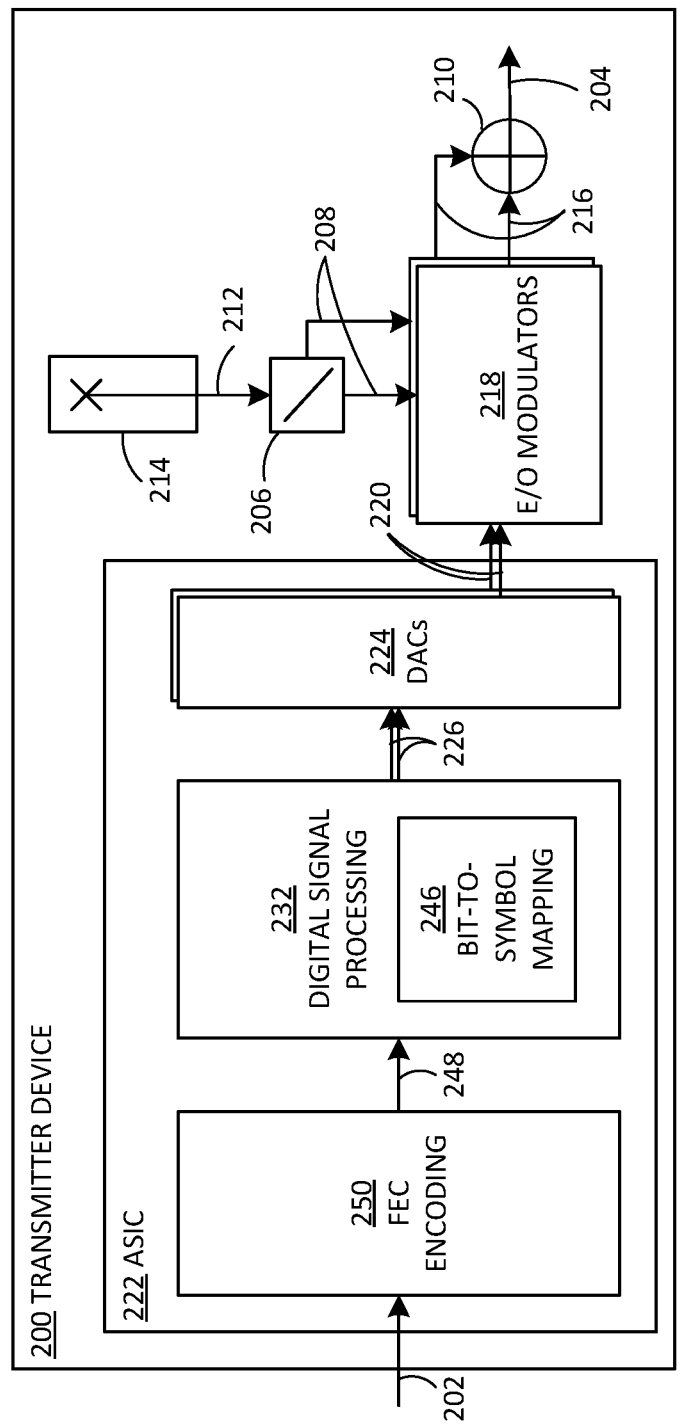
FIG. 2 illustrates an example transmitter device in accordance with some examples of the technology disclosed herein.

FIG. 2 illustrates an example transmitter device 200, in accordance with some examples of the technology disclosed herein. The transmitter device 200 is an example of the transmitter device 102. The transmitter device 200 may comprise additional components that are not described in this document.

The transmitter device 200 is configured to transmit an optical signal 204 which is representative of information bits (also referred to as client bits) 202. According to some examples, the transmitter device 200 employs polarization-division multiplexing (PDM). In other examples, generation of the optical signal 204 may involve alternative techniques, such as single polarization modulation, modulation of an unpolarized carrier, mode-division multiplexing, spatial-division multiplexing, Stokes-space modulation, polarization balanced modulation, and the like. A laser 214 is configured to generate a continuous wave (CW) optical carrier 212. A polarizing beam splitter 206 is configured to split the CW optical carrier 212 into polarized components 208 that are modulated by electrical-to-optical (E/O) modulators 218 to produce modulated polarized optical signals 216 that are combined by a beam combiner 210, thus yielding the optical signal 204. In some examples (not shown), the polarizing beam splitter 206 and the beam combiner 210 may be replaced with simple power splitters and combiners. Together, elements such as the E/O modulators 218, the laser 214, the beam splitter 206, and the beam combiner 210 may form a communication interface configured to transmit optical signals to other devices in a communication network, such as the network 100.

The transmitter device 200 may comprise an application specific integrated circuit (ASIC) 222. The ASIC 222 may be configured to apply forward error correction (FEC) encoding 250 to the client bits 202 to generate FEC-encoded bits 248. Examples of the FEC encoding 250 will be described further with respect to FIGS. 4, 6, 8, and 10.

The ASIC 222 may be further configured to apply digital signal processing 232 to the FEC-encoded bits 248. As part of the processing 232, the FEC-encoded bits 248 may be mapped to one or more streams of data symbols according to a bit-to-symbol mapping 246. The processing 232 may further comprise digital up-sampling of the symbols, as well as operations that are subsequently applied to the sampled waveform, either in the time domain or the frequency domain. Such operations may include pulse shaping, frequency division multiplexing (FDM), distortion pre-compensation, and CD pre-compensation. The processing 232 may include the application of one or more filters, which may involve the application of one or more Fast Fourier Transforms (FFTs) and one or more corresponding inverse FFTs (IFFTs).

The processing 232 may output digital drive signals 226, which comprise electrical representations of the optical spectrum that are to be used in the transmission of the optical signal 204. For example, the digital drive signals 226 may comprise four signals corresponding, respectively, to the in-phase (I) and quadrature (Q) components of the X polarization and the I and Q components of the Y polarization.

The transmitter device 200 comprises a plurality of digital-to-analog converters (DACs) 224 which may be used to convert the digital drive signals 226 into respective analog drive signals 220. Although illustrated as comprised in the ASIC 222, in an alternate implementation the DACs 224 or portions thereof may be separate from the ASIC 222. The DACs 224 may be controlled by a signal received from a voltage-controlled oscillator (VCO) (not shown). The analog drive signals 220 are used to drive the E/O modulators 218, which ultimately results in the optical signal 204.

According to some examples (not shown), the FEC encoding 250 may be applied to symbols, rather than bits. In such examples, the bit-to-symbol mapping 246 may be moved upstream of at least some portion of the steps comprised in the FEC encoding 250. Alternatively, bits may be mapped to multi-bit symbols, and then a plurality of the multi-bit symbols may be mapped to transmission symbols, for example, three bits to 8-level pulse-amplitude modulation (8-PAM), and four 8-PAM to dual-polarization 64-level quadrature amplitude modulation (64-QAM).

Figure 3:
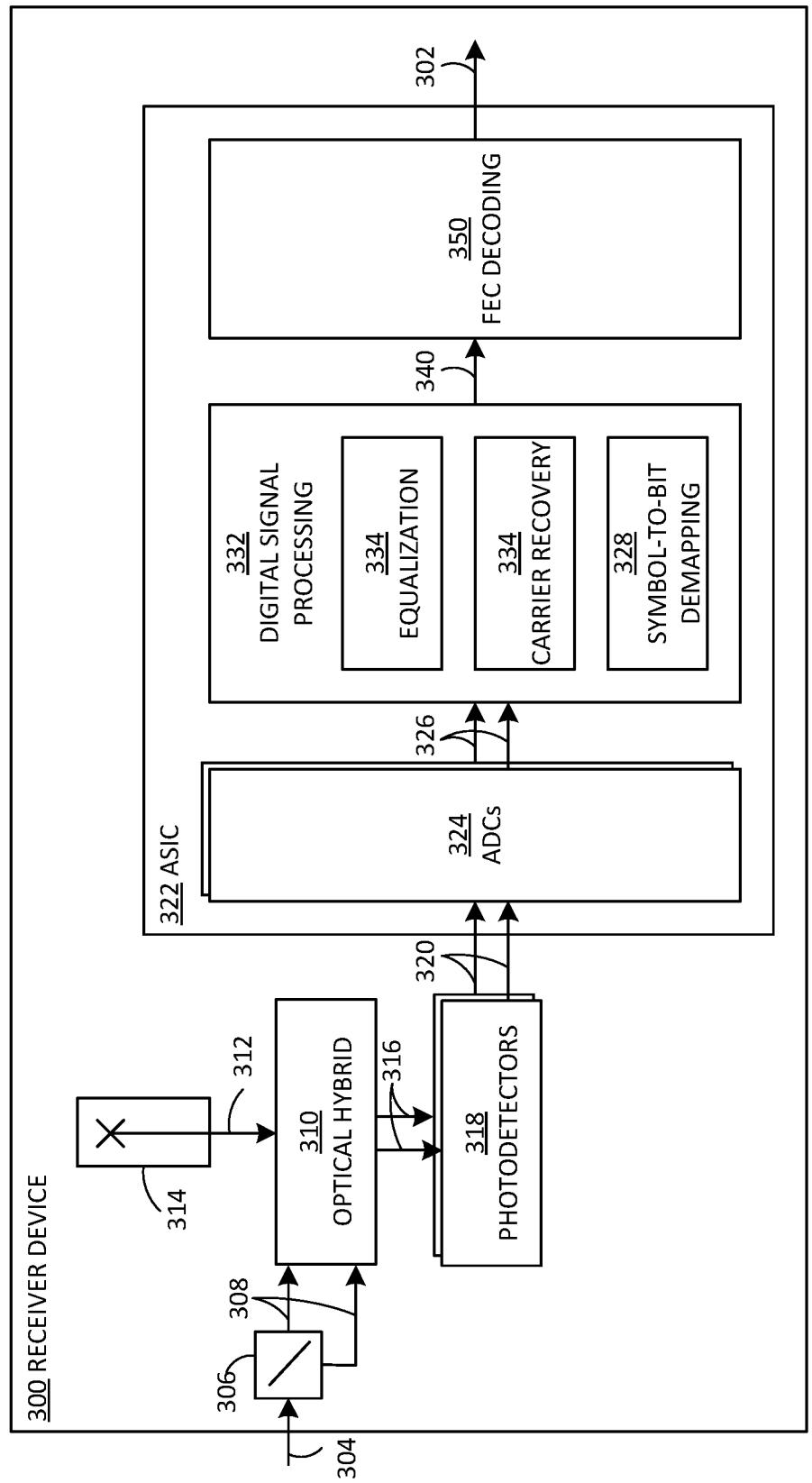
FIG. 3 illustrates an example receiver device in accordance with some examples of the technology disclosed herein.

FIG. 3 illustrates an example receiver device 300, in accordance with some examples of the technology disclosed herein. The receiver device 300 is an example of the receiver device 104. The receiver device 300 may comprise additional components that are not described in this document.

The receiver device 300 is configured to recover corrected client bits 302 from a received optical signal 304. The received optical signal 304 may comprise a degraded version of an optical signal generated by a transmitter device, such as the optical signal 204 generated by the transmitter device 200.

The receiver device 300 may comprise a polarizing beam splitter 306 configured to split the received optical signal 304 into polarized components 308. According to one example, the polarized components 208 may comprise orthogonally polarized components corresponding to an X polarization and a Y polarization. An optical hybrid 310 is configured to process the components 308 with respect to an optical signal 312 produced by a laser 314, thereby resulting in optical signals 316. Photodetectors 318 are configured to convert the optical signals 316 output by the optical hybrid 310 to analog signals 320. According to one example, the analog signals 320 may comprise four signals corresponding, respectively, to the I and Q components of the X polarization and the I and Q components of the Y polarization. Together, elements such as the beam splitter 306, the laser 314, the optical hybrid 310 and the photodetectors 318 may form a communication interface configured to receive optical signals from other devices in a communication network, such as the network 100.

The receiver device 300 may comprise an ASIC 322. The ASIC 322 may comprise analog-to-digital converters (ADCs) 324 which are configured to sample the analog signals 320, and to generate respective digital signals 326. Although illustrated as comprised in the ASIC 322, in an alternate implementation the ADCs 324 or portions thereof may be separate from the ASIC 322. The ADCs 324 sample the analog signals 320 periodically at a sample rate that is based on a signal received from a voltage-controlled oscillator (VCO) at the receiver device 300 (not shown).

The ASIC 322 is configured to apply digital signal processing 332 to the digital signals 326. The processing 332 may comprise equalization processing 334 which is designed to compensate for a variety of channel impairments, such as CD, SOP rotation, PMD including group delay (GD) and differential group delay (DGD), PDL or PDG, and other effects. The equalization processing 334 may comprise the application of one or more filters to the digital signals 320, either in the time domain or the frequency domain or both. The equalization processing 334 may involve the application of one or more FFTs and one or more corresponding IFFTs.

The digital signal processing 332 may comprise carrier recovery 334, thereby accounting for the difference between the frequency of the transmitter laser 214 and the frequency of the receiver laser 314.

The digital signal processing 332 may comprise symbol-to-bit demapping 328 using a decision circuit, thereby resulting in signals 340 which are representative of bit estimates. The received optical signal 304 may be representative of symbols comprising FEC-encoded bits generated as a result of applying FEC encoding to client bits. Accordingly, the signals 340 may further undergo FEC decoding 350 to recover the corrected client bits 302. Examples of the FEC decoding 350 will be described further with respect to FIGS. 5, 7, 9, and 11.

U.S. Pat. No. 10,367,600 to Oveis Gharan et al. describes techniques for FEC with contrast coding, which may be used to tune the BERs experienced by different subsets of bits, relative to each other, to better match a plurality of FEC schemes.

Figure 4:
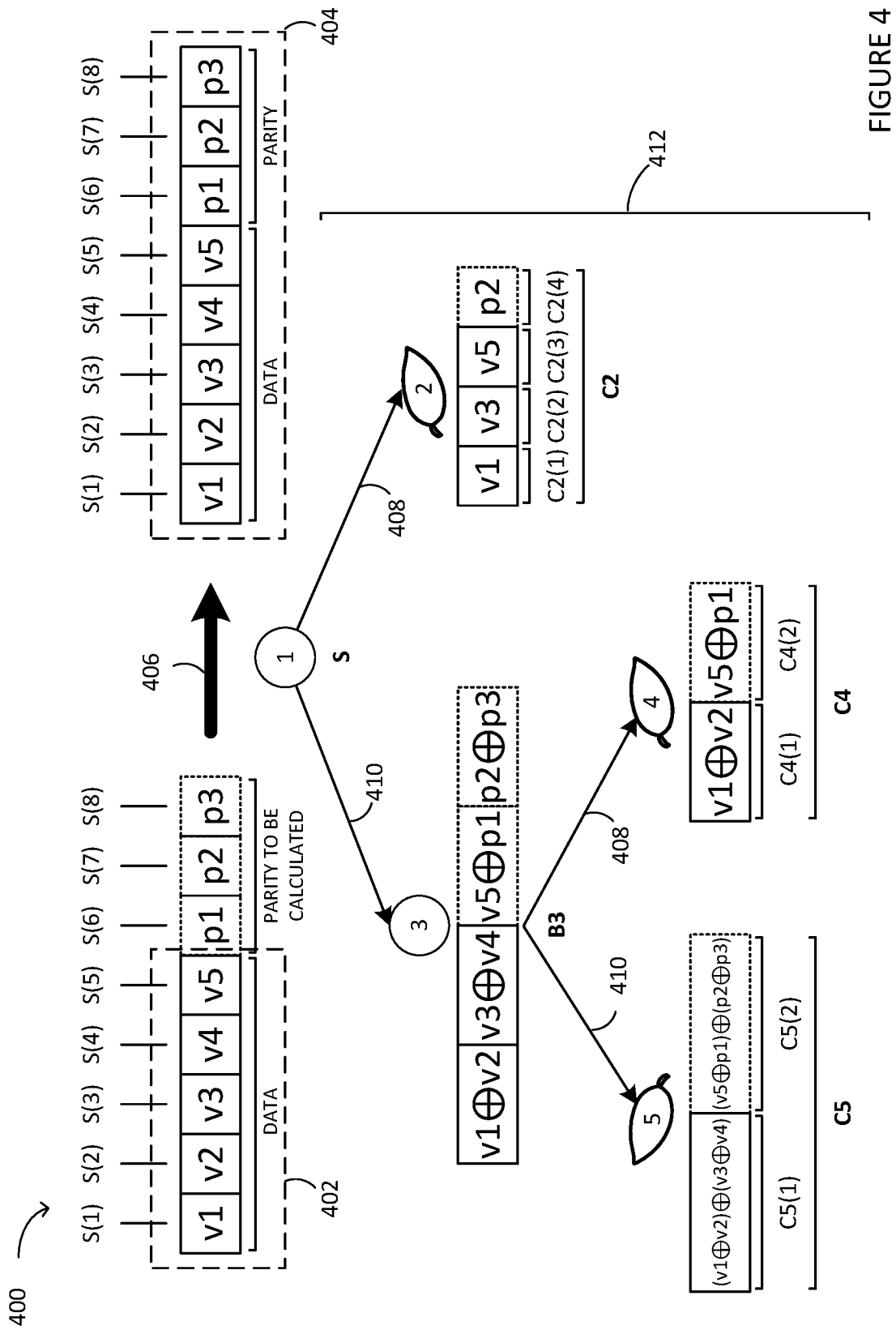
FIG. 4 illustrates a schematic showing forward error correction (FEC) encoding in accordance with an example tree structure.

FIG. 4 illustrates a schematic 400 showing an example of the FEC encoding 250 implemented by the transmitter device 200. For simplicity, the schematic 400 involves systematic encoding of bits using unspecified FEC codes. In general, the FEC codes used in a tree structure may be capable of reducing the likelihood of errors, for example, to below some maximum acceptable BER. In some examples, a given FEC code may be capable of correcting a single error, while in other examples, a given FEC code may be capable of correcting multiple errors. In some examples, a given FEC code may be systematic, while in other examples, a given FEC code may be non-systematic.

The schematic 400 illustrates a process for generating an encoded vector 404 from a data vector 402 using FEC encoding according to a tree structure 412. In this example, the data vector 402 is denoted by V=[v1 v2 v3 v4 v5], where v1 . . . v5 are elements of Galois field GF(2). Following the systematic FEC encoding, denoted by the arrow 406, the resulting encoded vector 404 comprises the original five bits of the data vector 402, as well as three parity bits, denoted by P=[p1 p2 p3], for a total of eight bits. The data vector 402 is an example of the client bits 202, while the encoded vector 404 is an example of the encoded bits 248.

The FEC encoding 406 is the process by which the parity bits p1, p2, p3 are calculated based on the tree structure 412 and combined with the data vector 402 to generate the encoded vector 404. In some examples, FEC encoding 406 may be achieved by matrix multiplication. For example, the 5-bit data vector 402 may be multiplied by a unique 8×5 generator matrix to generate the encoded vector 404, where the values of the parity bits p1, p2, and p3 are calculated by matrix multiplication of the data bits v1, v2, v3, v4, v5 and the respective terms in the generator matrix. In this example, the matrix multiplication is mathematically equivalent to operations implemented within the tree structure 412.

In general, a vector to be encoded by a tree structure may be referred to as a root vector, and may comprise either bits or symbols. In some examples, the root vector may include parity bits or symbols which are initially undefined, and may be determined using the tree structure. The point at which the root vector is input to the tree structure may be referred to as the root node. Various mathematical operations may be applied to the root vector to generate two or more new vectors, where each new vector corresponds to a new node of the tree structure. In this case, the root vector may be referred to as a parent vector, and the two or more new vectors may be referred to as "child vectors." Additional mathematical operations may be applied to the child vectors to generate new child vectors, where each new child vector corresponds to a different node of the tree structure. Certain nodes of the tree structure correspond to child vectors that do not undergo any further mathematical operations. These nodes may be referred to as leaf nodes, and the child vectors at these nodes may be referred to as leaf vectors. A tree structure may be designed such that a leaf vector is equal to a codeword of a FEC code. In some examples, a leaf vector may be equal to a fixed or frozen sequence of values. Nodes other than the root node and the leaf nodes may be referred to as branch nodes, and the vectors at these nodes may be referred to as branch vectors or intermediate vectors. A branch vector may be a child vector of a preceding branch vector or the root vector. A branch vector may also be a parent vector of two or more subsequent branch vectors or leaf vectors.

Child vectors may be formed from the terms of parent vectors using various mathematical operations, including linear and non-linear operations. According to some examples, for any given parent vector, a plurality of child vectors may be generated using one or more distinct mathematical operations. According to some examples, each child vector may be generated using exactly the same mathematical operation, applied to different subsets of terms of the parent vector. According to some examples, at least one child vectors may be generated using a first mathematical operation, while at least one other child vector may be generated using a second mathematical operation that is distinct from the first mathematical operation.

The tree structure 412 used in the current example comprises five nodes. Node 1 is the root node, node 3 is a branch node, and nodes 2, 4, and 5 are leaf nodes. In this case, the root vector is denoted by $S=[S(1)\ S(2)\ S(3)\ S(4)\ S(5)\ S(6)\ S(7)\ S(8)]$ and comprises the five bits of the data vector 402, as well as the three parity bits which are yet to be calculated. The spaces for these parity bits are shown in dotted lines. According to some examples, the initial values of the to-be-calculated parity bits p1, p2, and p3 may be set to 0.

The mathematical operations implemented in the tree structure 412 include an odd-bit selection operation 408, and a pairwise exclusive-or (XOR) operation 410, where the XOR operator is denoted by $\oplus$. The odd-bit selection operation 408 generates a child vector by selecting the odd bits from the vector of the parent node. The XOR operation 410 generates a child vector by applying the XOR operator to adjacent pairs of bits from the vector of the parent node.

It should be noted that the tree structure 412 is merely one simple example of a tree structure that may be used for FEC encoding. Many different configurations and mathematical operations are possible. In general, the FEC encoding described herein may be achieved using any tree structure that generates three or more leaf vectors from a root vector using recursive mathematical operations, where at least one of the leaf vectors is a result of a recursion (or repetition) of a mathematical operation. According to some examples, a recursion of a mathematical operation may involve applying a particular operation to a branch vector, where that branch vector is itself the result of applying exactly the same operation to a preceding branch vector (or the root vector), and where the operation involves only the terms of the vector to which it is being applied. According to other examples, a recursion of a mathematical operation may involve a context-dependent selection of a function or a parameterized function to be applied, while retaining a recursive characteristic. For example, a recursion may involve the selection of a particular function from a plurality of possible functions that are to be recursively applied to vectors in the tree structure, where the selection may depend on the particular vector to which the function is to be applied, including, for example, the position of the vector within the tree structure, the values of the terms of the vector, and/or other context-dependent parameters. According to some examples, distinct operations may be performed at leaf nodes, depending on context.

The tree structure 412 is designed to systematically encode the 5-bit data vector 402 by appending it with three parity bits, thereby resulting in the 8-bit encoded vector 404. The three parity bits p1, p2, and p3 are calculated from the operations implemented within the tree structure 412, which will now be described.

At node 1, the odd-bit selection operation 408 is applied to the root vector S to generate a child vector at node 2, consisting of the odd bits of the root vector, namely $[S(1)\ S(3)\ S(5)\ S(7)]=[v1\ v3\ v5\ p2]$, where p2 represents a to-be-calculated parity bit to be used at the position S(7) of the root vector S. Since node 2 is a leaf node, the node-2 vector is a leaf vector which must form a codeword of a particular FEC code. In this case, the codeword is denoted by C2 and consists of four bits, such that $C2=[C2(1)\ C2(2)\ C2(3)\ C2(4)]$. The values of the bits $C2(1)$, $C2(2)$, and $C2(3)$ are equal to the data bits, v1, v3, and v5, respectively. The value of $C2(4)$, which corresponds to the parity bit to be calculated, must be set to a value that satisfies the constraint $C2=[v1\ v3\ v5\ C2(4)]$, where C2 is one of a plurality of possible codewords of a FEC code used at leaf node 2. This value for $C2(4)$ is denoted by p2. Once the value of p2 has been determined such that the node-2 constraint is satisfied, the value of $S(7)$, which was initially unknown, is replaced by the value p2. In this manner, the operations implemented by the tree structure 412 have generated one of the three parity bits of the root vector S.

The XOR operation 410 is applied to the root vector S at node 1 to generate a child vector at branch node 3. The node-3 vector is denoted by B3 and consists of four bits, where each bit is calculated from the XOR of adjacent pairs of bits of the node-1 vector, such that $B3=[(S(1)\oplus S(2))\ (S(3)\oplus S(4))\ (S(5)\oplus S(6))\ (S(7)\oplus S(8))]$. Thus, the first bit of B3 is equal to $v1\oplus v2$, and the second bit of B3 is equal to $v3\oplus v4$. The third bit of B3 is equal to $v5\oplus p1$, where p1 represents a to-be-calculated parity bit to be used at the position S(6) of the root vector S. The fourth bit of B3 is equal to $p2\oplus p3$, where the value of p2 is known as a result of the operation at leaf node 2, and where p3 represents a to-be-calculated parity bit to be used at the position S(8) of the root vector S.

Node 3 is not a leaf node, so the operations 408 and 410 are performed recursively on B3. Specifically, the odd-bit selection operation 408 is applied to B3 to generate a child vector at node 4, consisting of the odd bits of B3, namely the first bit equal to $v1\oplus v2$, and the third bit equal to $v5\oplus p1$, where, as noted previously, p1 represents a to-be-calculated parity bit for the position S(6) of the root vector S.

Since node 4 is a leaf node, the node-4 vector is a leaf vector which must form a codeword of a FEC code. In this case, the codeword is denoted by C4 and consists of two bits, such that $C4=[C4(1)\ C4(2)]$. The value of the bit $C4(1)$ is equal to v1⊕v2. The value of the bit C4(2) must be set to satisfy the constraint C4=[(v1⊕v2) C4(2)], where C4 is one of a plurality of possible codewords of a FEC code used at leaf node 4. As previously noted, the second bit of the codeword C4 is equal to v5⊕p1. Thus, once a value of C4(2) has been selected that satisfies the constraint that C4 is a FEC codeword, the value of C4(2) may be used to calculate the value of p1 to be used at S(6). This calculation may be made using the equation p1=v5⊕C4(2). As a simple example, if the FEC code used at leaf node 4 was a repetition code, then the two terms of C4 would have to be identical, such that C4(2)=C4(1)=(v1⊕v2). Accordingly, the value of p1 to be used at S(6) would be calculated as p1=v5⊕C4(2)=v5⊕(v1⊕v2). Once the value of p1 has been calculated, this value may be used at the position S(6). In this manner, the operations implemented by the tree structure 412 have generated another one of the three parity bits of the root vector. There remains only one parity bit to be calculated.

The pairwise XOR operation 410 is also applied to B3 to generate a child vector at node 5. The node-5 vector consists of two bits, where each bit is calculated from the XOR of adjacent pairs of bits of B3, such that the node-5 vector is equal to {[(S(1)⊕S(2))⊕(S(3)⊕S(4))] [S(5)⊕S(6))⊕(S(7)⊕S(8))]}. Thus, the first bit of the node-5 vector is equal to (v1⊕v2)⊕(v3⊕v4). The second bit of the node-5 vector is equal to (v5⊕p1)⊕(p2⊕p3), where the value of p1 is known as a result of the operation at leaf node 4, where the value of p2 is known as a result of the operation at leaf node 2, and where p3 represents a to-be-calculated parity bit to be used at the position S(8) of the root vector S.

Since node 5 is a leaf node, the node-5 vector is a leaf vector which must form a codeword of a FEC code. In this case, the codeword is denoted by C5 and consists of two bits, such that C5=[C5(1) C5(2)]. The value of the bit C5(1) is equal to (v1⊕v2)⊕(v3⊕v4). The value of the bit C5(2) must be set to satisfy the constraint C5=[(v1⊕v2)⊕(v3⊕v4) C5(2)], where C5 is one of a plurality of possible codewords of a FEC code used at leaf node 5. As previously noted, the second bit of the codeword C5 is equal to (v5⊕p1)⊕(p2⊕p3). Thus, once a value of C5(2) has been selected that satisfies the constraint that C5 is a FEC codeword, the value of C5(2) may be used to calculate the value of p3 to be used at S(8). This calculation may be made using the equation p3=(v5⊕p1)⊕p2(1)C5(2). Now the value of S(8), which was initially unknown, is replaced by the value p3. In this manner, the operations implemented by the tree structure 412 have generated the third and final parity bit of the root vector.

For simplicity, the FEC codewords used in this example are short (i.e., either two or four terms long). However, in practice, it is contemplated that the FEC codewords may be longer. According to some examples, at least one of the FEC codewords may comprise 15 or more terms.

In the current example, the tree structure 412 is applied to bits which are elements of Galois field GF(2). However, in general, FEC encoding using a tree structure may involve symbols that belong to sets with higher cardinalities, such as elements of higher order Galois fields.

In the current example, the encoded vector 404 is generated from the data vector 402 using systematic FEC encoding, such that the encoded vector 404 includes the terms of the data vector 402 (namely, the bits v1 . . . v5) in addition to the appended parity terms (namely, the bits p1, p2, and p3). However, an encoded vector may alternatively be generated from input data using non-systematic FEC encoding. In general, an encoded vector may be generated from a vector of data terms (i.e., bits or symbols), where the encoded vector comprises encoded terms (i.e., bits or symbols) that include parity information. Where systematic encoding is used, the parity information may comprise parity terms that are appended to the data terms to form the encoded vector.

The odd-bit selection operation 408 and the XOR operation 410 are merely examples of possible mathematical operations or functions that may be recursively applied in a tree structure. Other operations, both linear and non-linear, are possible, such as linear combination with arbitrary coefficients, Galois Field additions, modulo operations, and the like. Applying these operations may generally be referred to as "information combining", since the operations results in child vectors that are based on different combinations of the information contained in the parent vector. The child vectors generated by a tree structure are co-dependent because they all rely on the terms comprised in the root node.

According to some examples, the recursive linear operations of a tree structure for encoding of input vector may be achieved by an equivalent matrix multiplication between the input vector and a unique generator matrix, where the matrix may be implemented in hardware. For example, the tree structure 412 for encoding of input vectors may be embodied by a unique linear matrix, since the operations 408 and 410 involve linear information combining.

Figure 5:
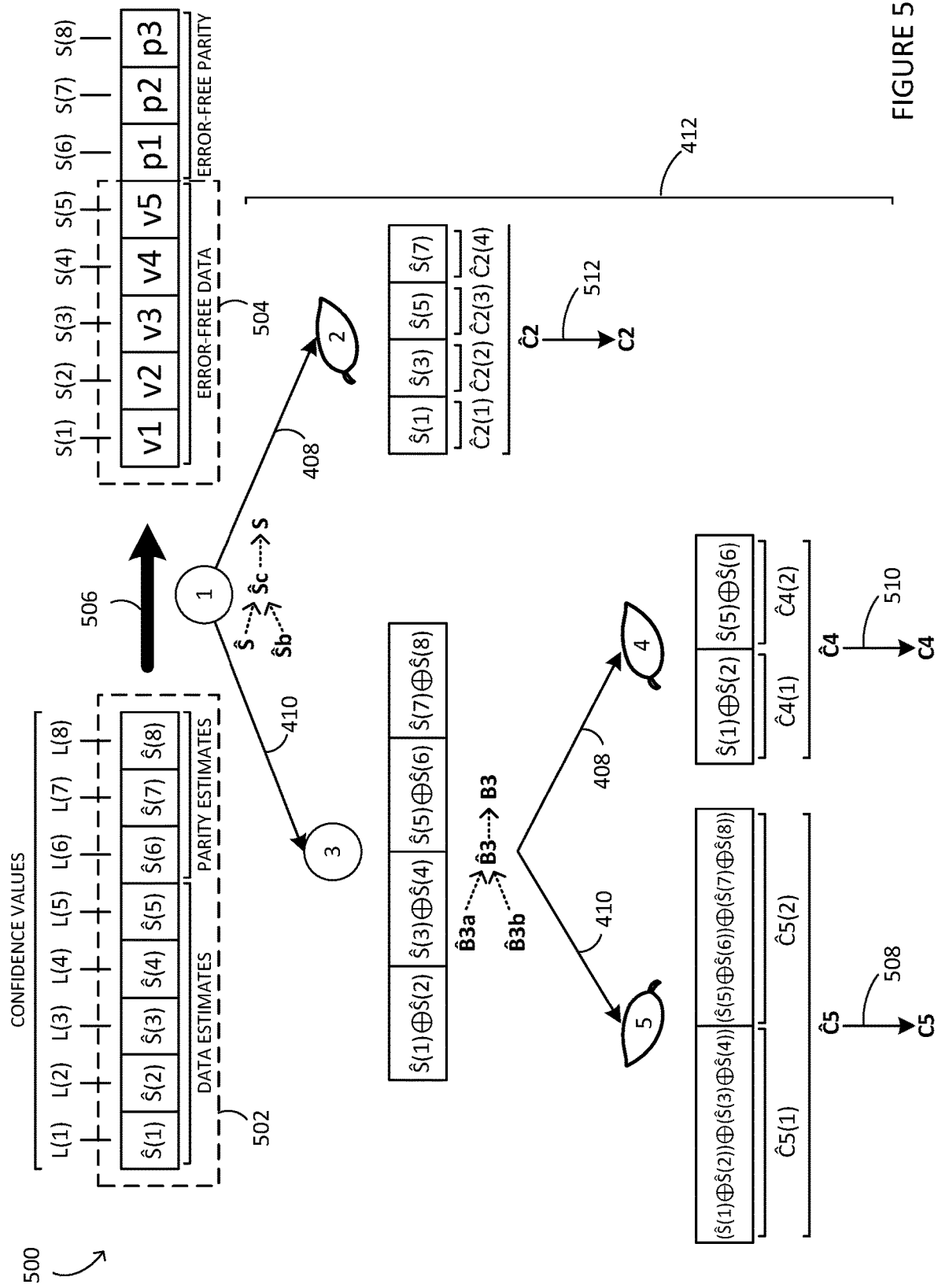
FIG. 5 illustrates a schematic showing FEC decoding in accordance with the example tree structure of FIG. 4.

FIG. 5 illustrates a schematic 500 showing an example of the FEC decoding 350 implemented by the receiver device 300. The schematic 500 represents the decoding that corresponds to the encoding illustrated in the schematic 400.

As denoted by the arrow 506, a vector 502 consisting of five data bit estimates and three parity bit estimates is to be decoded to generate an error-free data vector 504 consisting of five error-free data bits. The decoding also generates three error-free parity bits. The vector 502 is an example of the bits 340 input to the FEC decoding 350, while the vector 504 is an example of the bits 302. Assuming all bit errors have been corrected during the FEC decoding, the vector 504 is expected to be identical to the data vector 402 to which the FEC encoding was applied, as illustrated in FIG. 4.

The vector 502 is denoted by $\hat{S}=[\hat{S}(1)\ \hat{S}(2)\ \hat{S}(3)\ \hat{S}(4)\ \hat{S}(5)\ \hat{S}(6)\ \hat{S}(7)\ \hat{S}(8)]$, where each value (i) is associated with a respective confidence value denoted by L(i), for i=1 . . . 8. In the case where the values of Ŝ are binary, a log likelihood ratio (LLR) may be used to simultaneously represent each Ŝ(i)/L(i) pair, such that the sign of the LLR for bit i denotes whether Ŝ(i) equals 0 or 1, and the magnitude of the LLR for bit i denotes the confidence in that value. In the case of non-binary values of Ŝ, there may be a vector of confidence values for each element of Ŝ.

The FEC decoding denoted by the arrow 506 is performed using the same tree structure illustrated in FIG. 4. In this case, the root vector is Ŝ and the confidence values L=[L(1) L(2) L(3) L(4) L(5) L(6) L(7) L(8)] are used during the decoding.

At node 1, the XOR operation 410 is applied to the root vector S to generate a child vector $\hat{B}3a=[(\hat{S}(1)\oplus(2))\ (\hat{S}(3)\oplus\hat{S}(4))\ (\hat{S}(5)\oplus\hat{S}(6))\ (\hat{S}(7)\oplus\hat{S}(8))]$. The confidence value of each bit of $\hat{B}3a$ may be calculated as the minimum of the respective confidence values from which the bit was calculated. For example, the first bit of $\hat{B}3a$, which is equal to (Ŝ(1)⊕Ŝ(2)), may have a confidence value equal to min(L(1), L(2)).

At node 3, the operation 410 is applied recursively to $\hat{B}3a$, thereby generating the bit estimates $\hat{C}5(1)=(\hat{S}(1)\oplus\hat{S}(2))\oplus(\hat{S}(3)\oplus\hat{S}(4))$ and $\hat{C}5(2)=(\hat{S}(5)\oplus\hat{S}(6))\oplus(\hat{S}(7)\oplus\hat{S}(8))$ at leaf node 5. The respective confidence values of the bit estimates $\hat{C}5(1)$ and $\hat{C}5(2)$ are denoted $L_{C5}(1)$ and $L_{C5}(2)$. The confidence value of each bit estimate may be calculated as the minimum of the respective confidence values from which the bit estimate was calculated. For example, the first bit of the node-5 vector may have a confidence value equal to min{min(L(1), L(2)), (min(L(3), L(4))}.

Based on the FEC encoding performed at the transmitter, it is expected that the bit estimates $\hat{C}5(1)$ and $\hat{C}5(2)$ should, together, form a codeword C5 of a particular FEC code at leaf node 5. Thus, the vector $\hat{C}5=[\hat{C}5(1)\ \hat{C}5(2)]$ may be referred to as a codeword estimate. If the codeword estimate $\hat{C}5$ is not equal to the codeword C5, then it may be determined that the codeword estimate $\hat{C}5$ contains at least one error. The confidence values $L_{C5}(1)$ and $L_{C5}(2)$ may be used together with the values of $\hat{C}5(1)$ and $\hat{C}5(2)$ in an attempt to correct one or more errors, thereby resulting in an error-free codeword C5, as denoted by arrow 508. The term "error-free" generally refers to an error probability that is below some threshold deemed tolerable for a given application (i.e., "error-free with acceptable reliability"). One may consider an example where the FEC code used at leaf node 5 is a repetition code, meaning that C5(1) should be equal to C5(2). In the event that $\hat{C}5(1)\neq\hat{C}5(2)$, the respective confidence values $L_{C5}(1)$ and $L_{C5}(2)$ may be used in an attempt to correct either $\hat{C}5(1)$ or $\hat{C}5(2)$. For example, if $L_{C5}(1)>L_{C5}(2)$, it may be determined that $\hat{C}5(2)$ is more likely to be incorrect than $\hat{C}5(1)$. In this case, the value $\hat{C}5(2)$ may be flipped (e.g., from 0 to 1, or from 1 to 0) to obtain a corresponding value C5(2), which may be considered error-free. Since the value of $\hat{C}5(1)$ has the higher confidence $L_{C5}(1)$, it may be determined to be correct and may be denoted by the value C5(1), which is also deemed error-free.

Leaf node 5 provides the error-free information that $(\hat{S}(1)\oplus\hat{S}(2))\oplus(\hat{S}(3)\oplus\hat{S}(4))=C5(1)$, and $(\hat{S}(5)\oplus\hat{S}(6))\oplus(\hat{S}(7)\oplus\hat{S}(8))=C5(2)$. This information may be used to improve the decoding performed at the other leaf nodes, as will now be described.

The odd bits of the node-3 vector (i.e., the first bit and the third bit) are selected to form the vector at leaf node 4. In the case of the first bit, one estimate for the value of this bit is the value $\hat{B}3a(1)=\hat{S}(1)\oplus\hat{S}(2)$, which is calculated using the values of (1) and (2) that were obtained from the root vector 502. The confidence value associated with this estimate may be calculated as $L_{B3a}(1)=\min(L(1), L(2))$. However, an additional estimate of the first bit of the node-3 vector may also be calculated using the additional information provided by leaf node 5, namely that $(\hat{S}(1)\oplus\hat{S}(2))=C5(1)\oplus(\hat{S}(3)\oplus\hat{S}(4))$. Thus, the additional estimate of the first bit of the node-3 vector is $\hat{B}3b(1)=C5(1)\oplus(\hat{S}(3)\oplus\hat{S}(4))$, which is calculated using the values of $\hat{S}(3)$ and $\hat{S}(4)$ that were obtained from the root vector 502 and the error-free value C5(1) obtained from the decoding at leaf node 5. The confidence value associated with this estimate may be calculated as $L_{B3b}(1)=\min(L(3), L(4))$. Thus, there are now two estimates of the first bit of the node-3 vector: $\hat{B}3a(1)$ and $\hat{B}3b(1)$. In a similar manner, it is also possible to generate two estimates of the third bit of the node-3 vector, denoted $\hat{B}3a(3)$ and $\hat{B}3b(3)$, where $\hat{B}3a(3)=(\hat{S}(5)\oplus\hat{S}(6))$ and has a confidence value of $L_{B3a}(3)=\min(L(5), L(6))$, and where $\hat{B}3b(3)=C5(2)\oplus(\hat{S}(7)\oplus\hat{S}(8))$ and has a confidence value of $L_{B3b}(3)=\min(L(7), L(8))$.

The two estimates $\hat{B}3a(1)$ and $\hat{B}3b(1)$ may be combined to generate an estimate $\hat{B}3(1)$ with a corresponding confidence value $L_{B3}(1)$. The precise nature of the combination depends on the values of the estimates $\hat{B}3a(1)$ and $\hat{B}3b(1)$ and their respective confidence values $L_{B3a}(1)$ and $L_{B3b}(1)$. For example, in the event that $\hat{B}3a(1)=\hat{B}3b(1)$, then it follows that $\hat{B}3(1)=\hat{B}3a(1)=\hat{B}3b(1)$, and $L_{B3}(1)=L_{B3a}(1)+L_{B3b}(1)=\min(L(1), L(2))+\min(L(3), L(4))$. In this case, because the two estimates $\hat{B}3a(1)$ and $\hat{B}3b(1)$ are the same, the confidence in the ultimate estimate of $\hat{B}3(1)$ is higher than the confidence in the estimate $\hat{B}3a(1)$. In the event that $\hat{B}3a(1)\neq\hat{B}3b(1)$, then the estimate having the higher confidence value is used as the estimate of $\hat{B}3(1)$, and $L_{B3}(1)=|L_{B3a}(1)-L_{B3b}(1)|=|\min(L(1), L(2))-\min(L(3), L(4))|$. In this case, because the two estimates $\hat{B}3a(1)$ and $\hat{B}3b(1)$ differ from each other, the confidence in the ultimate estimate of $\hat{B}3(1)$ is lower than the confidence in the estimate $\hat{B}3a(1)$. In both cases, the additional information provided by the estimate $\hat{B}3b(1)$ ultimately enhances the estimate of $\hat{B}3(1)$.

A similar process may be used to combine the two estimates $\hat{B}3a(3)$ and $\hat{B}3b(3)$ to generate an estimate for $\hat{B}3(3)$, and corresponding confidence value $L_{B3}(3)$. For example, in the event that $\hat{B}3a(3)=\hat{B}3b(3)$, then it follows that $\hat{B}3(3)=\hat{B}3a(3)=\hat{B}3b(3)$, and $L_{B3}(3)=L_{B3a}(3)+L_{B3b}(3)=\min(L(5), L(6))+\min(L(7), L(8))$. In this case, because the two estimates $\hat{B}3a(3)$ and $\hat{B}3b(3)$ are the same, the confidence in the ultimate estimate of $\hat{B}3(3)$ is higher than the confidence in the estimate $\hat{B}3a(2)$. In the event that $\hat{B}3a(3)\ \hat{B}3b(3)$, then the estimate having the higher confidence value is used as the estimate of $\hat{B}3(3)$, and $L_{B3}(3)=|L_{B3a}(3)-L_{B3b}(3)|=|\min(L(5), L(6))-\min(L(7), L(8))|$. In this case, because the two estimates $\hat{B}3a(3)$ and $\hat{B}3b(3)$ differ from each other, the confidence in the estimate of $\hat{B}3(3)$ is lower than the confidence in the estimate $\hat{B}3a(3)$. In both cases, the additional information provided by the estimate $\hat{B}3b(3)$ ultimately enhances the estimate of $\hat{B}3(3)$.

Thus, estimates of the odd bits of $\hat{B}3$ are calculated by combining estimates of the odd bits of $\hat{B}3a$ and $\hat{B}3b$, where $\hat{B}3a$ is based on certain values of the root vector $\hat{S}$, and where $\hat{B}3b$ is based on certain values of the root vector $\hat{S}$ as well as certain values of the error-free codeword C5.

The codeword estimate $\hat{C}4$ is calculated by applying the odd-bit selection operation 408 to $\hat{B}3$. Thus, $\hat{C}4(1)=\hat{B}3(1)$ with a confidence value $L_{C4}(1)=L_{B3}(1)$, while $\hat{C}4(2)=\hat{B}3(3)$ with a confidence value $L_{C4}(2)=L_{B3}(3)$. It is expected that the codeword estimate $\hat{C}4=[\hat{C}4(1)\ \hat{C}4(2)]$ should be equal to a codeword C4 of a particular FEC code used at leaf node 4. If the values of $\hat{C}4(1)$ and $\hat{C}4(2)$ do not form a codeword C4, then it may be determined that at least one of the values is incorrect. The confidence values $L_{C4}(1)$ and $L_{C4}(2)$ may be used together with the values $\hat{C}4(1)$ and $\hat{C}4(2)$ in an attempt to correct one or more errors, thereby resulting in an error-free codeword C4, as denoted by arrow 510. One may consider an example where the FEC code used at leaf node 4 is a repetition code, meaning that C4(1) should be equal to C4(2). In the event that $\hat{C}4(1)\neq\hat{C}4(2)$, the respective confidence values $L_{C4}(1)$ and $L_{C4}(2)$ may be used in an attempt to correct either $\hat{C}4(1)$ or $\hat{C}4(2)$. For example, if $L_{C4}(1)>L_{C4}(2)$, it may be determined that $\hat{C}4(2)$ is more likely to be incorrect that $\hat{C}4(1)$. In this case, the value $\hat{C}4(2)$ may be flipped (e.g., from 0 to 1, or from 1 to 0) to obtain a corresponding error-free value, denoted C4(2). Since the value of $\hat{C}4(1)$ has the higher confidence $L_{C4}(1)$, it may be determined to be correct and may be denoted by the value C4(1), which is also deemed error-free.

Leaf node 4 provides the error-free information that $\hat{S}(1)\oplus\hat{S}(2)=C4(1)$, and $\hat{S}(5)\oplus\hat{S}(6)=C4(2)$. In addition, as previously noted, leaf node 5 provides the error-free information that $(\hat{S}(1)\oplus\hat{S}(2))\oplus(\hat{S}(3)\oplus\hat{S}(4))=C5(1)$, and $(\hat{S}(5)\neq\hat{S}(6))\oplus(\hat{S}(7)\oplus\hat{S}(8))=C5(2)$. Therefore, by combining the error-free information provided from leaf nodes 4 and 5, it is possible to recover the error-free value of each bit of the node-3 vector B3. Specifically, $B3(1)=C4(1)$; $B3(2)=C4(1) \oplus C5(1)$; $B3(3)=C4(2)$; and $B3(4)=C4(2) \oplus C5(2)$. The error-free bits of B3 may now be used in the decoding performed at leaf node 2.

The odd bits of the root vector $\hat{S}$ (i.e., first bit, third bit, fifth bit, seventh bit) are selected to form the vector at leaf node 2. Referring to the first bit, one estimate of the value of this bit is simply the value of $\hat{S}(1)$ obtained from the root vector, which has a confidence value $L(1)$. However, node 3 has provided the additional information that $\hat{S}(1)=B3(1) \oplus \hat{S}(2)$, where the value of $B3(1)=C4(1)$ is error-free. Thus an additional estimate of the value of the first bit of the root vector, denoted $\hat{S}b(1)$, may be obtained using the value of $\hat{S}(2)$ obtained from the root vector, as well as the error-free value of $B3(1)$ obtained from branch node 3. The confidence value for the additional estimate $\hat{S}b(1)$ is $L_{Sb}(1)=L(2)$. Thus, there are now two estimates of the first bit of the root vector: (i) $\hat{S}(1)$ having a confidence value of $L(1)$, and (ii) $\hat{S}b(1)=B3(1) \oplus \hat{S}(2)$ having a confidence value of $L_{Sb}(1)=L(2)$. In a similar manner, two estimates of the third bit of the root vector may be generated: (i) $\hat{S}(3)$ having a confidence value of $L(3)$, and (ii) $\hat{S}b(3)=B3(2) \oplus \hat{S}(4)$ having a confidence value of $L_{Sb}(3)=L(4)$. Two estimates of the fifth bit of the root vector may be generated: (i) $\hat{S}(5)$ having a confidence value of $L(5)$, and (ii) $\hat{S}b(5)=B3(3) \oplus \hat{S}(6)$ having a confidence value of $L_{Sb}(5)=L(6)$. Finally, two estimates of the seventh bit of the root vector may be generated: (i) $\hat{S}(7)$ having a confidence value of $L(7)$, and (ii) $\hat{S}b(7)=B3(4) \oplus \hat{S}(8)$ having a confidence value of $L_{Sb}(7)=L(8)$.

Each pair of estimates may be combined to generate a respective bit estimate that is ultimately used at leaf node 2. For example, the two estimates $\hat{S}(1)$ and $\hat{S}b(1)$ may be combined to generate an estimate $\hat{S}c(1)$, with a corresponding confidence value $L_{Sc}(1)$, where the precise nature of the combination depends on the values of the estimates $\hat{S}(1)$ and $\hat{S}b(1)$ and their respective confidence values $L(1)$ and $L_{Sb}(1)=L(2)$, as described previously. Ultimately, the four odd bits of a vector $\hat{S}c$ are calculated by combining estimates of the odd bits of $\hat{S}$ with the odd bits $\hat{S}b$, where $\hat{S}b$ is based on certain values of the root vector $\hat{S}$ as well as certain values of the error-free codewords C5 and C4. The additional information provided by the estimates of $\hat{S}b$ ultimately enhances the estimates of $\hat{S}c$ relative to the estimates of $\hat{S}$ alone. This sequential decoding process may decrease the likelihood of errors.

The codeword estimate $\hat{C}2$ is calculated by applying the odd-bit selection operation 408 to $\hat{S}c$. Thus, $\hat{C}2(1)=\hat{S}c(1)$ with a confidence value $L_{C2}(1)=L_{Sc}(1)$; $\hat{C}2(2)=\hat{S}c(3)$ with a confidence value $L_{C2}(2)=L_{Sc}(3)$; $\hat{C}2(3)=\hat{S}c(5)$ with a confidence value $L_{C2}(3)=L_{Sc}(5)$; and $\hat{C}2(4)=\hat{S}c(7)$ with a confidence value $L_{C2}(4)=L_{Sc}(7)$. It is expected that the codeword estimate $\hat{C}2=[\hat{C}2(1) \ \hat{C}2(2) \ \hat{C}2(3) \ \hat{C}2(4)]$ should be equal to a codeword C2 of a particular FEC code used at leaf node 2. If the values of $\hat{C}2(1)$, $\hat{C}2(3)$, and $\hat{C}2(4)$ do not form a codeword C2, then it may be determined that at least one value is incorrect. The confidence values $L_{C2}(1)$, $L_{C2}(2)$, $L_{C2}(3)$, and $L_{C2}(4)$ may be used together with the values of $\hat{C}2(1)$, $\hat{C}2(3)$, and $\hat{C}2(4)$ in an attempt to correct one or more errors, thereby resulting in an error-free codeword C2, as denoted by arrow 512. For example, in the case of single error, if $L_{C2}(2)$ is the lowest of the four confidence values, it may be determined that $\hat{C}2(2)$ is the most likely bit to be incorrect. In this case, the value $\hat{C}2(2)$ may be flipped (e.g., from 0 to 1, or from 1 to 0) to obtain a corresponding error-free value, denoted C2(2). The other values $\hat{C}2(1)$, $\hat{C}2(3)$, and $\hat{C}2(4)$ may be determined to be correct and therefore denoted as respective error-free values C2(1), C2(3), and C2(4).

Once all of the codewords C2, C4, and C5 are deemed error-free, the error-free values S(1), S(2), S(3), S(4), S(5), S(6), S(7), and S(8) are output by the FEC decoding 506. Where all errors have been corrected, the error-free values S(1) ... S(5), denoted by 504, are identical to the data vector V=[v1 v2 v3 v4 v5], and the error-free values S(6) ... S(8) are identical to the parity bits P=[p1 p2 p3].

The recursive operations performed when decoding according to a tree encoding structure, such as the structure 412, may cause noise to become more concentrated at some leaf nodes than other leaf nodes. For example, the recursive application of the XOR operation 410 at node 1 and then at node 3 results in the vector at node 5 being a function of all eight bits of the root vector S, where each of these bits contributes noise. In contrast, the single application of the odd-bit selection operation 408 at node 1 results in the vector at node 2 being a function of only four bits of the root vector S. Thus, an initial estimate of the codeword C2 may suffer from less noise than an initial estimate of the codeword C5. Leaf nodes with higher concentrations of noise may be assigned lower-rate FEC codes comprising higher concentrations of parity, such that errors arising from the higher noise may be corrected. For example, since the codeword estimate $\hat{C}5$ is expected to have a higher concentration of noise than the codeword estimate $\hat{C}2$, the codeword C5 may comprise a higher concentration of parity bits than the codeword C2. In other words, a stronger FEC code is used at leaf node 5 than at leaf node 2. According to some examples, leaf nodes with stronger FEC codes may be decoded prior to leaf nodes with weaker FEC codes. The error-free information obtained from the leaf nodes with the stronger FEC codes may be used to assist with the decoding at leaf nodes with weaker FEC codes.

Figure 6:
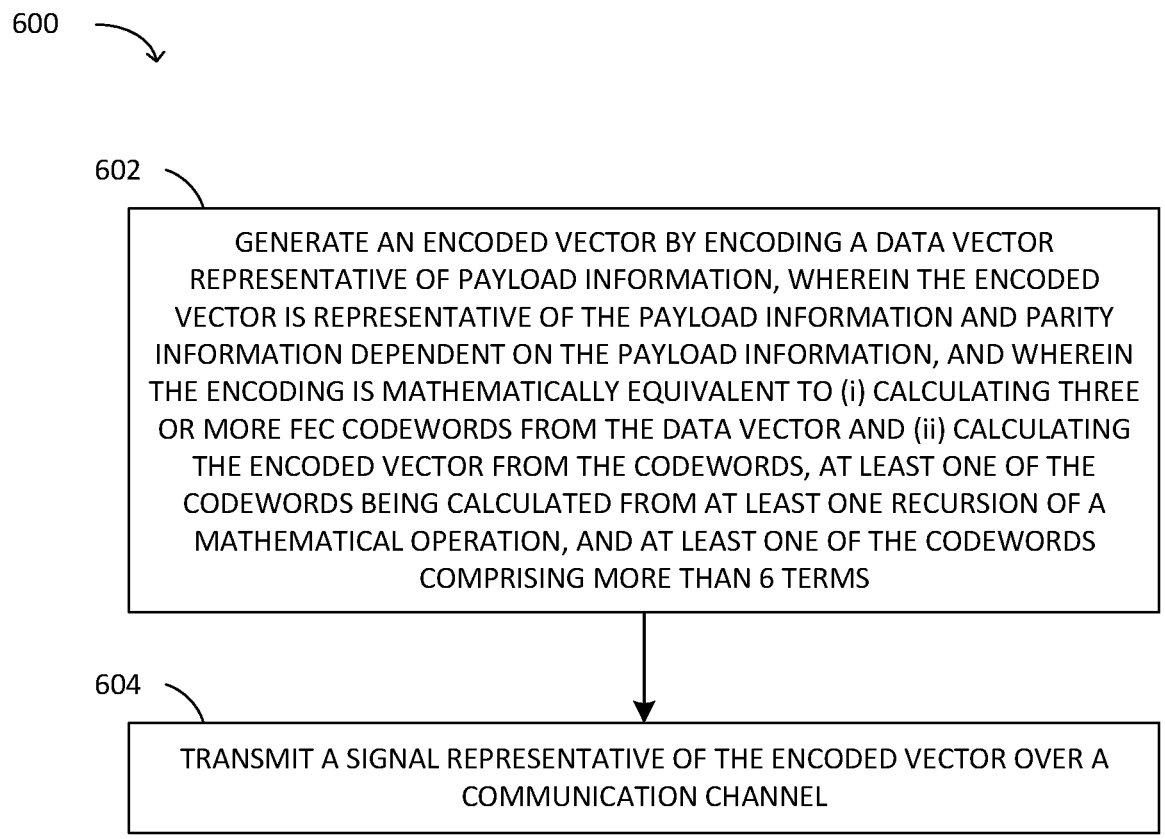
FIG. 6 illustrates an example method for FEC encoding accordance with some examples of the technology disclosed herein.

FIG. 6 illustrates an example method 600 for FEC encoding using a tree structure in accordance with some examples of the technology disclosed herein. The method 600 may be performed at a transmitter device, such as the transmitter device 102 or 200.

At 602, the transmitter device generates an encoded vector by encoding a data vector representative of payload information. The data vector may be made up of terms comprising bits or symbols. Examples of the data vector include the bits 202 described with respect to FIG. 2, and the data vector 402 described with respect to FIG. 4. The encoded vector is representative of the payload information and parity information that is dependent on the payload information. The encoded vector may be made up of terms comprising bits or symbols. Examples of the encoded vector include the encoded bits 248 described with respect to FIG. 2, and the encoded vector 404 described with respect to FIG. 4. According to some examples, the encoded vector is systematically encoded, such that it comprises terms representative of the payload information (e.g., bits v1 ... v5 of the encoded vector 404) appended to terms representative of the parity information (e.g., bits p1 ... p3 of the encoded vector 404).

The encoding performed at 602 is mathematically equivalent to (i) calculating a plurality of codewords from the data vector and (ii) calculating the encoded vector from the codewords, where each codeword belongs to one of a plurality of FEC codes. According to some examples, the plurality of codewords may comprise three or more codewords. Examples of the codewords include the codewords C2, C4, and C5, which are equal to the vectors at leaf nodes 2, 4, and 5, respectively, in FIG. 4. As described with respect to FIG. 4, the encoding 406 is mathematically equivalent to the encoding operations implemented in the tree structure 412, which include calculating one branch vector and three leaf vectors from the data vector 402, and then using the three leaf vectors (which are codewords of various FEC codes) to calculate the encoded vector 404. In this example, the encoded vector 404 is calculated by appending the parity bits p1 . . . p3 to the data bits v1 . . . v5, where the parity bits p1 . . . p3 have been calculated using the leaf vectors, as described with respect to FIG. 4.

According to some examples, each codeword calculated at 602 belongs to a different FEC code. According to other examples, two or more of the codewords calculated at 602 may belong to the same FEC code. According to some examples, the codewords calculated at 602 belong to at least two different FEC codes of different rates. For example, as described with respect to FIG. 4, the FEC code for which C2 is a codeword has a higher rate than the FEC code for which C5 is a codeword.

According to some examples, the FEC codes used for encoding may comprise any combination of Bose, Chaudhuri, and Hocquenghem (BCH) codes, shortened binary BCH codes, Reed-Solomon (RS) codes, Reed-Muller codes, and repetition codes.

According to some examples, at least one of the codewords is calculated from at least one recursion of a mathematical operation. For example, the codeword C5 is calculated from a first recursion, at node 3, of the XOR operation 410, where the initial application of the XOR operation 410 was at node 1.

According to some examples, at least one of the codewords comprises more than 6 terms. According to some examples, at least one of the codewords comprises more than 14 terms. According to some examples, at least one of the codewords comprises more than 30 terms.

According to some examples, the encoding performed at 602 may be implemented using the recursive application of mathematical operations, for example, as described with respect to FIG. 4. According to other examples, the encoding performed at 602 may be implemented by multiplying the data vector with a unique matrix in hardware at the transmitter device to generate the encoded data vector, where the matrix multiplication is mathematically or functionally equivalent to the recursive application of the mathematical operations.

Once the encoded vector is generated at 602, the transmitter device may transmit a signal representative of the encoded vector over a communication channel at 604, such as the communication channel 106. For example, the signal may comprise an optical signal, such as the signal 204, which has been modulated based on the encoded vector, as described with respect to FIG. 2. The signal may be transmitted to a receiver device, such as the receiver device 104 or 300.

Figure 7:
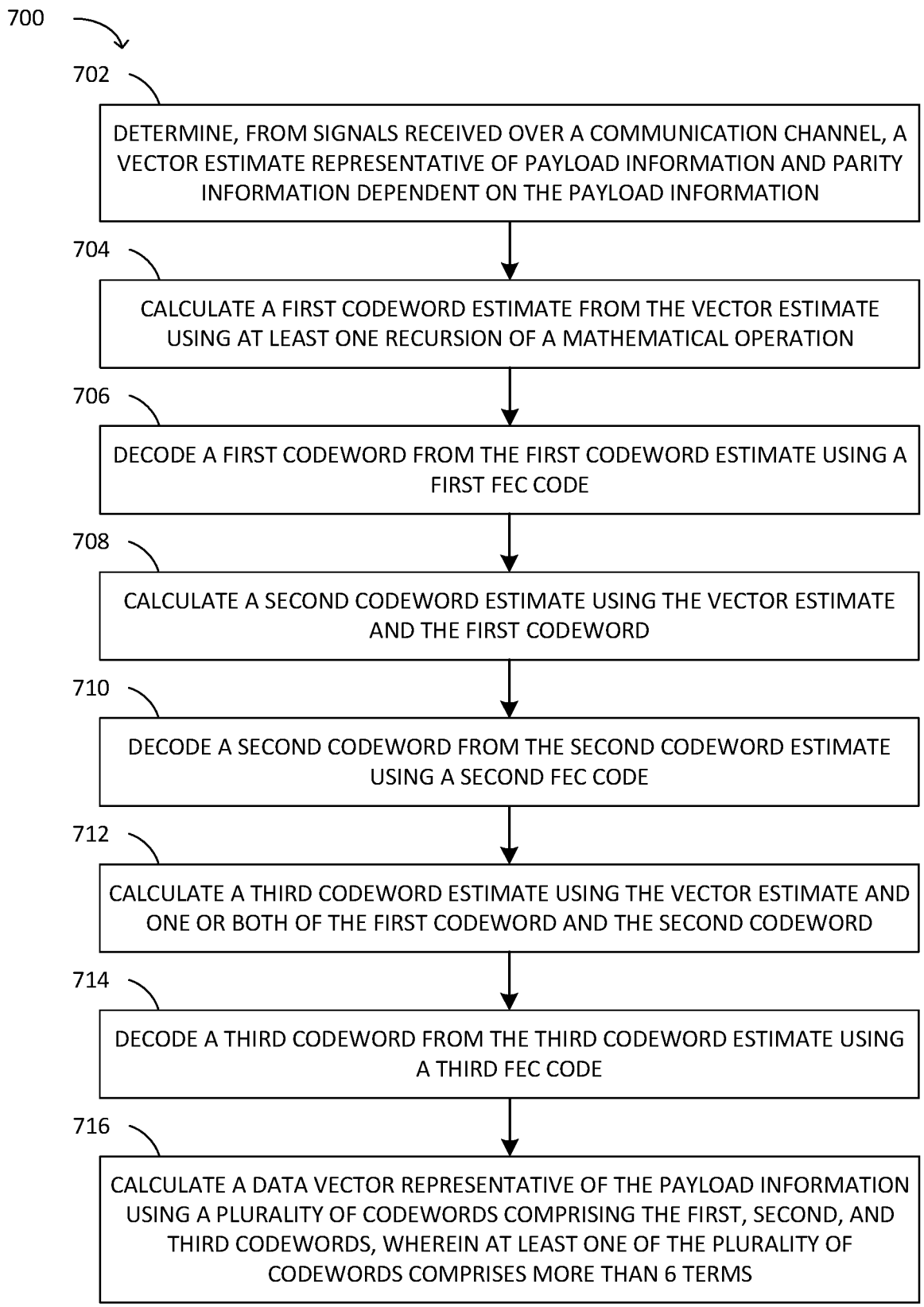
FIG. 7 illustrates an example method for FEC decoding accordance with some examples of the technology disclosed herein.

FIG. 7 illustrates an example method 700 for FEC decoding using a tree structure in accordance with some examples of the technology disclosed herein. The method 700 may be performed at a receiver device, such as the receiver device 104 or 300.

At 702, the receiver device determines, from a signal received over a communication channel, a vector estimate representative of payload information and parity information dependent on the payload information. The vector estimate may be made up of terms comprising bits or symbols. Examples of the vector estimate include the bits 340 described with respect to FIG. 3, and the vector estimate $\hat{S}$ 502 described with respect to FIG. 5. According to some examples, each term of the vector estimate may comprise or be associated with a respective confidence value.

The remainder of the method 700 comprises steps for decoding the vector estimate in order to generate a data vector that is representative of the payload information.

At 704, the receiver device calculates a first codeword estimate from the vector estimate using at least one recursion of a mathematical operation. For example, the codeword estimate $\hat{C}5$ at leaf node 5 is calculated by initially applying the XOR operation to terms of the vector estimate $\hat{S}$ at node 1, thereby resulting in the initial vector estimate $\hat{B}3a$ at branch node 3, followed by recursively applying the XOR operation 410 to $\hat{B}3a$ to ultimately arrive at the codeword estimate $\hat{C}5$.

At 706, the receiver device decodes a first codeword from the first codeword estimate calculated at 704 using a first FEC code. For example, the error-free codeword C5 is generated by decoding the codeword estimate $\hat{C}5$ using the FEC code associated with leaf node 5. According to some example, the first codeword estimate may comprise or be associated with confidence values, and the decoding of the first codeword may be based, in part, on those confidence values. For example, the confidence values $L_{C5}(1)$ and $L_{C5}(2)$ associated with the terms $\hat{C}5(1)$ and $\hat{C}5(2)$, respectively, may be used during the decoding in an attempt to correct errors in $\hat{C}5$ (if necessary), thereby resulting in the codeword C5.

At 708, the receiver device calculates a second codeword estimate using the vector estimate and the first codeword decoded at 706. For example, as previously described, an initial vector estimate $\hat{B}3a$ at branch node 3 is calculated by applying the XOR operation 410 to terms of the vector estimate $\hat{S}$ at node 1. However, as a result of the decoding performed at leaf node 5, an additional vector estimate $\hat{B}3b$ is generated at branch node 3, which is based on terms of the vector estimate $\hat{S}$ as well as the codeword C5. The estimates $\hat{B}3a$ and $\hat{B}3b$ are combined to generate an estimate B3, from which the codeword estimate $\hat{C}4$ is ultimately calculated. Accordingly, the codeword estimate $\hat{C}4$ is an example of a second codeword estimate being calculated using the vector estimate (i.e., terms of $\hat{S}$) and the first codeword (i.e., C5). In this particular example, the second codeword estimate is calculated based the XOR operation 410 being applied to vector estimate $\hat{S}$, followed by the odd-bit selection operation 408 being applied to the vector estimate $\hat{B}3$. Other examples are contemplated wherein the second codeword estimate is calculated using at least one recursion of a mathematical operation.

At 710, the receiver device decodes a second codeword from the second codeword estimate calculated at 708 using a second FEC code. For example, the error-free codeword C4 is generated by decoding the codeword estimate $\hat{C}4$ using the FEC code associated with leaf node 4. According to some example, the second codeword estimate may comprise or be associated with confidence values, and the decoding of the second codeword may be based, in part, on those confidence values. For example, the confidence values $L_{C4}(1)$ and $L_{C4}(2)$ associated with the terms $\hat{C}4(1)$ and $\hat{C}4(2)$, respectively, may be used during the decoding in an attempt to correct errors in $\hat{C}4$ (if necessary), thereby resulting in the codeword C4.

At 712, the receiver device calculates a third codeword estimate using the vector estimate and either one or both of the first codeword decoded at 706 and the second codeword decoded at 710. For example, as previously described, as a result of the decoding performed at leaf nodes 5 and 4, an additional vector estimate Ŝb is generated at the root node, which is based on terms of the vector estimate Ŝ as well as the codewords C5 and C4. The estimates Ŝ and Ŝb are combined to generate an estimate from which the codeword estimate Ĉ2 is ultimately calculated. Accordingly, the codeword estimate Ĉ2 is an example of a third codeword estimate being calculated using the vector estimate (i.e., terms of Ŝ) the first codeword (i.e., C5), and the second codeword (i.e., C4). In this particular example, the third codeword estimate is calculated based the odd-bit selection operation 410 being applied to a vector estimate based on the combination of Ŝ and Ŝb. Other examples are contemplated wherein the third codeword estimate is calculated using at least one recursion of a mathematical operation.

Although not explicitly illustrated in FIG. 7, steps 712-714 may be repeated for each additional codeword estimate that is calculated and decoded. According to some examples, one or more codewords that are decoded earlier in the decoding method 700 may be used to enhance the estimates of one or more codewords that are to be decoded later in the decoding method 700.

According to some examples, at least one of the codewords comprises more than 6 terms. According to some examples, at least one of the codewords comprises more than 14 terms. According to some examples, at least one of the codewords comprises more than 30 terms.

According to some examples, the FEC codes used in the method 700, such as the first, second, and third FEC codes, may comprise two or more different FEC codes having different FEC rates. For example, the first FEC code may have a lower rate than the second FEC code, and/or the second FEC code may have a lower rate than the third FEC code. According to some examples, the FEC codes may comprise any combination of BCH codes, shortened binary BCH codes, RS codes, Reed-Muller codes, and repetition codes.

At 716, the receiver device calculates the data vector using the first, second, and third codewords decoded at 706, 710, and 714, respectively. The data vector may be made up of terms comprising bits or symbols. Examples of the data vector include the bits 302 described with respect to FIG. 3, and the error-free data vector 504 described with respect to FIG. 5. In the example of FIG. 5, each of the error-free values S(1), S(2), S(3), S(4), S(5), S(6), S(7), and S(8) may be calculated from the codewords C2, C4, and C5 that were decoded using the tree structure 412. In the event that all errors have been corrected, the values S(1) . . . S(5) are identical to the data vector V=[v1 v2 v3 v4 v5].

In the examples described thus far, encoding using a tree structure is applied directly to a data vector representative of payload information, which results in an encoded vector that is representative of the payload information and parity information dependent on the payload information. The encoded vector is then transmitted to a receiver where it is decoded using the tree structure, thereby recovering the data vector. However, other examples are contemplated wherein encoding using a tree structure is applied to other terms that are not representative of payload information.

U.S. Pat. No. 10,615,913 to Oveis Gharan et al. describes compression coding techniques for use with FEC coding, which may provide higher information rates by reducing the proportion of parity bits relative to information bits that are transmitted from the transmitter to the receiver. In one example, the transmitter calculates a plurality of determiners from a set of information bits, where each determiner is calculated as a first function of a respective first subset of the information bits. The transmitter then calculates a nub as a second function of the plurality of determiners, where the nub comprises a number of redundant bits that is less than a number of bits comprised in the plurality of determiners. The set of information bits is transmitted to the receiver in a first manner, and the nub is transmitted to the receiver in a second manner, where the first manner may be distinct from the second manner.

Examples will now be described wherein compression coding techniques, such as those described in U.S. Pat. No. 10,615,913, are combined with a tree structure.

Figure 8:
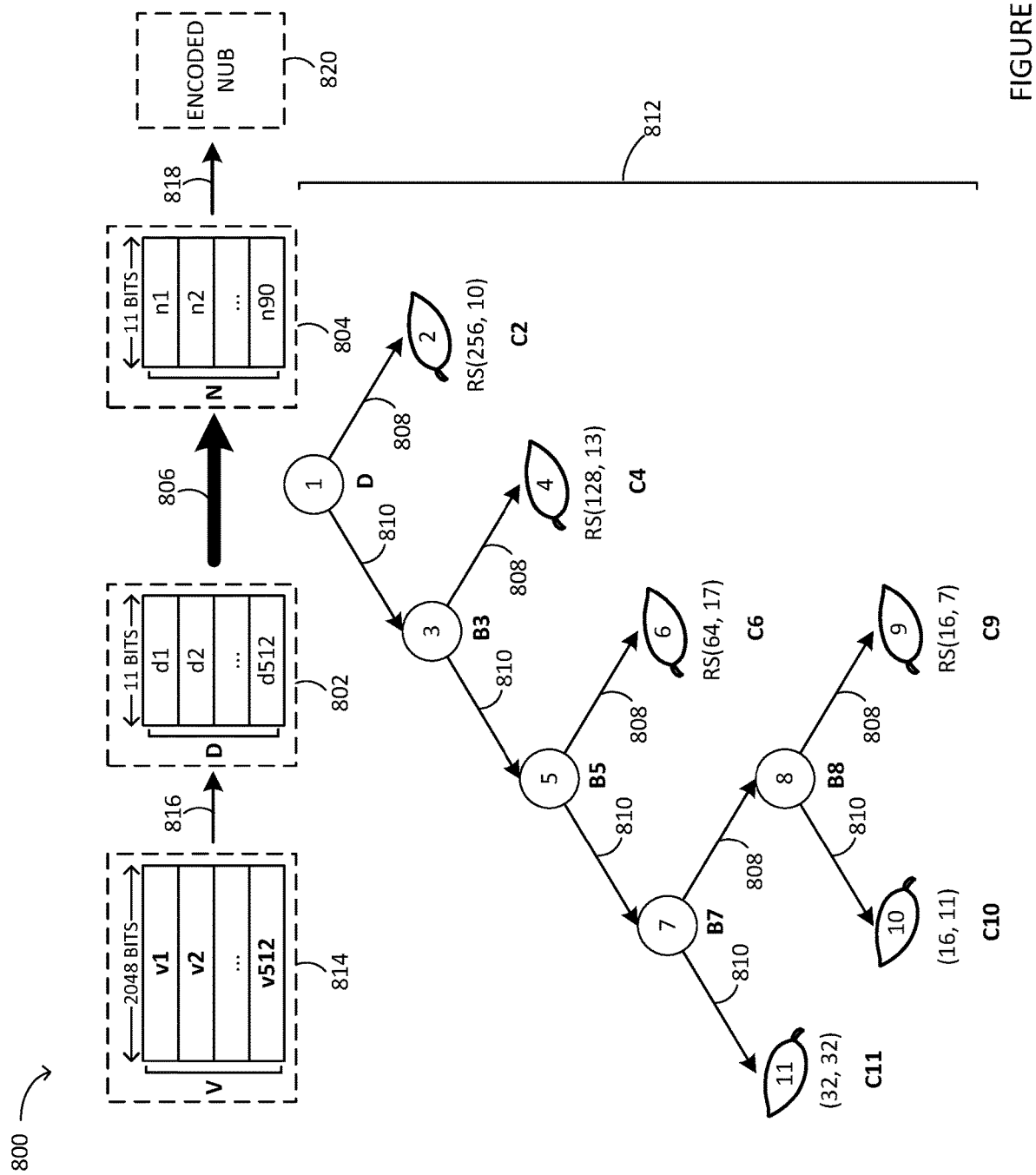
FIG. 8 illustrates a schematic for compression FEC encoding using an example tree structure.

FIG. 8 illustrates a schematic 800 showing an example of the FEC encoding 250 implemented by the transmitter device 200. In this example, compression coding is used.

The schematic 800 illustrates a process for generating a nub 804 from determiners 802 using FEC encoding according to a tree structure 812. In this example, the determiners 802 comprise 512 symbols which are denoted by a vector D=[d1 d2 . . . d512], where each symbol of the vector D consists of 11 bits. Each one of the determiners 802 is calculated as a function of a respective data vector belonging to a data set 814, which is denoted by V=[v1 v2 . . . v512], where each data vector of the data set V consists of 2048 bits. These calculations are collectively denoted by the arrow 816. The arrow 806 denotes the application of the FEC encoding to the determiners 802 to generate the nub 804, where the FEC encoding is mathematically equivalent to the operations implemented in the tree structure 812, to be described in detail below. In this example, the nub 804 comprises 90 symbols which are denoted by a vector N=[n1 n2 . . . n90], where each symbol of the vector N consists of 11 bits. The nub 804 may be encoded using a different FEC encoding scheme from the FEC encoding 806, as denoted by arrow 818, thereby resulting in an encoded nub 820, which includes nub parity information calculated during the FEC encoding 818. In addition to the data set 814, the encoded nub 820 may be transmitted to a receiver device, where FEC decoding may be performed, as described with respect to FIG. 9. The data set 814 is an example of the client bits 202. The combination of the data set 814 and the encoded nub 820 is an example of the encoded bits 248.

The FEC encoding 806 is the process by which the symbols of the nub vector 804 are calculated, based on the tree structure 812. In some examples, the FEC encoding 806 may be achieved by matrix multiplication. For example, the 512-symbol vector of determiners 802 may be right multiplied by a unique 512×90 generator matrix to generate the 90-symbol nub vector 804. In this example, the matrix multiplication is mathematically equivalent to operations implemented within the tree structure 812.

The tree structure 812 used in the current example comprises 11 nodes. Node 1 is the root node, nodes 3, 5, 7, and 8 are branch nodes, and nodes 2, 4, 6, 9, 10, and 11 are leaf nodes. In this case, the root vector is the vector D of determiners 802. Because compression coding is being used, the tree structure 812 is only required to output the nub vector 804, rather than having to append the nub vector 804 to the determiners 802. Accordingly, the root vector consists solely of the determiners 802, and does not include spaces for parity symbols.

The mathematical operations implemented in the tree structure 812 include an odd-symbol selection operation 808, and a pairwise XOR operation 810. The odd-symbol selection operation 808 generates a child vector by selecting the odd symbols from the vector of the parent node. The XOR operation 810 generates a child vector by applying the XOR operator to adjacent pairs of symbols from the vector of the parent node.

At node 1, the odd-symbol selection operation 808 is applied to the root vector D, thereby generating a child vector at node 2, consisting of the odd symbols of the root vector, namely [d1 d3 . . . d511]. Node 2 is a leaf node so the symbols of the node-2 vector form a codeword C2 of the FEC code defined for that node. In this case, the FEC code defined for leaf node 2 is a Reed-Solomon code denoted by RS(256,10), which indicates that 10 "parity" symbols are to be generated as a function of 256 "data" symbols. In this scenario, each "parity" symbol is one of the symbols of the nub vector 804, and each "data" symbol is one of the determiner symbols 802. Thus, the code RS(256,10) is applied to the codeword C2=[C2(1) C2(2) . . . C2(256)] at leaf node 2 to generate 10 of the symbols of the nub vector N.

The XOR operation 810 is applied to the root vector at node 1 to generate a child vector at branch node 3. The node-3 vector is denoted by B3 and consists of 256 symbols, where each symbol is calculated from the XOR of adjacent pairs of symbols of the root vector D, such that B3= [(d1⊕d2) (d3⊕d4) . . . (d511⊕d512)].

Node 3 is not a leaf node, so the operations 808 and 810 are performed recursively on the node-3 vector. Specifically, the odd-symbol selection operation 808 is applied to the vector at node 3 to generate a child vector at node 4, consisting of the odd symbols of the node-3 vector. Since node 4 is a leaf node, the symbols of the node-4 vector form a codeword C4 of the FEC code defined for that node. In this case, the FEC code defined for leaf node 4 is RS(128,13), indicating that a RS code is applied to the codeword C4= [C4(1) C4(2) . . . C4(128)] to generate 13 symbols of the nub vector N. These 13 nub symbols are in addition to the nub symbols generated at leaf node 2.

In a similar manner, the operations 808 and 810 are applied recursively to generate 17 additional nub symbols from a 64-symbol RS codeword C6 at leaf node 6, to generate 7 additional nub symbols from a 16-symbol RS codeword C9 at leaf node 9, and to generate 11 additional nub symbols from a 16-symbol RS codeword C10 at leaf node 10. Leaf node 11 employs a repetition code instead of a RS code. Specifically, the symbols at leaf node 11 form a codeword C11 of a repetition code of length 2 denoted by (32,32), which indicates that the code generates 32 nub symbols that are identical to the respective 32 symbols of the codeword C11. In this manner, the operations implemented by the tree structure 812 generate all 90 symbols of the nub vector 804. During this recursive process, intermediate child vectors are also generated at branch nodes 5, 7, and 8, denoted by B5, B7, and B8, respectively.

The odd-symbol selection operation 808 and the XOR operation 810 are merely examples of possible mathematical operations or functions that may be recursively applied in the tree structure. As described with respect to FIG. 4, other operations, both linear and non-linear, are possible.

According to some examples, the operations of the tree structure 812 may be implemented using matrix multiplication in hardware.

Figure 9:
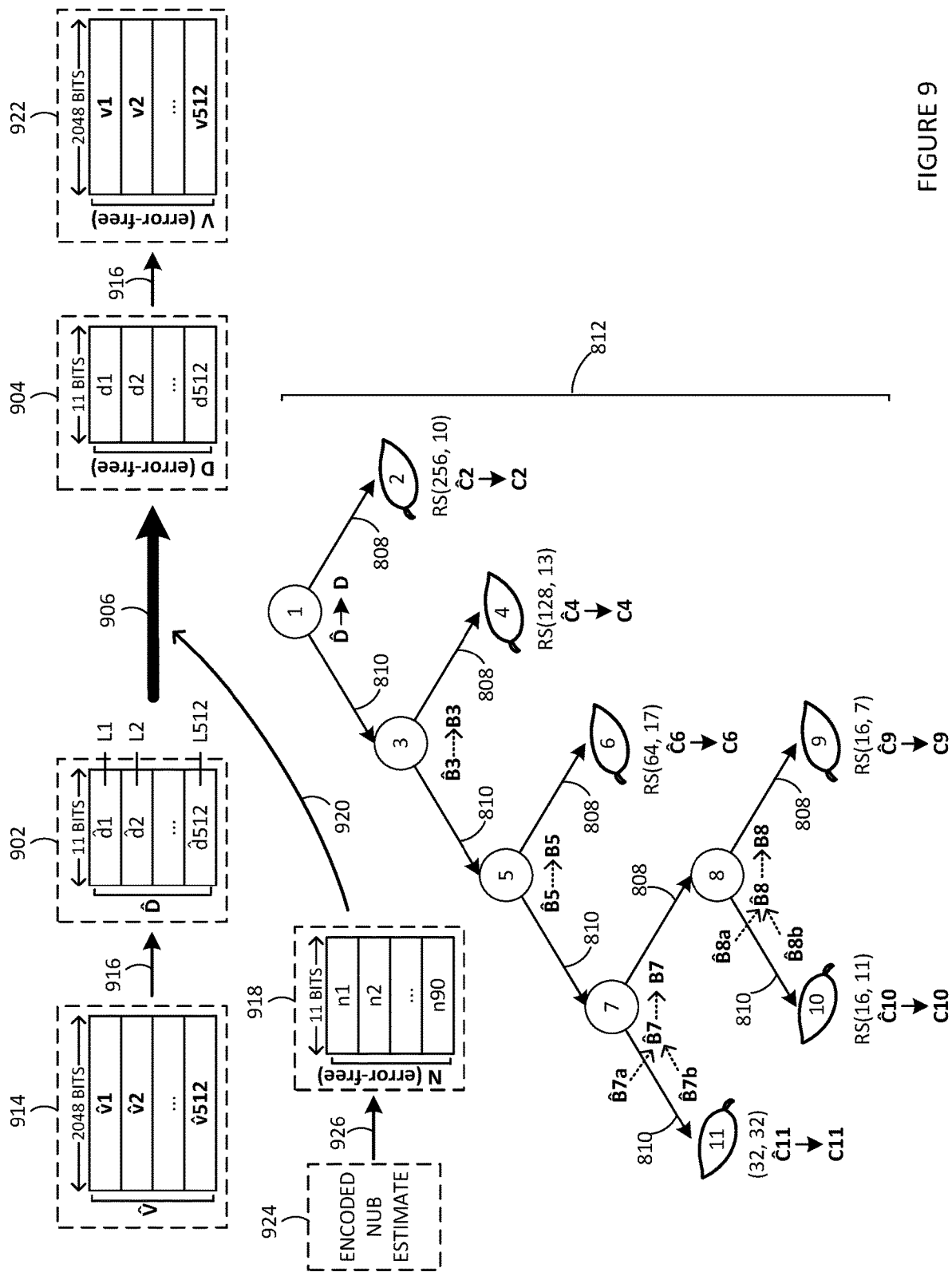
FIG. 9 illustrates an example schematic for compression FEC decoding using the example tree structure of FIG. 8.

FIG. 9 illustrates a schematic 900 showing an example of the FEC decoding 350 implemented by the receiver device 300. The schematic 900 represents the decoding that corresponds to the encoding illustrated in the schematic 800.

The receiver decodes a set of data estimates 914, corresponding to the data set 814 transmitted by the transmitter. The set of data estimates 914, denoted by $\hat{V}=[\hat{v}1\ \hat{v}2\ \ldots\ \hat{v}512]$, comprises 512 data vector estimates, where each data vector estimate comprises of 2048 bit estimates. According to some examples, the bit estimates may be hard-decision binary values. According to other examples, the bit estimates may be associated with respective confidence values.

For each data vector estimate of the set of data estimates 914, a respective determiner estimate may be calculated, thereby resulting in a vector of determiner estimates 902. The determiner estimates 902 are calculated using the same function that was applied during encoding at 816. Collectively, the calculation of the determiner estimates 902 is represented by the arrow 916.

The vector 902 is denoted by $\hat{D}=[\hat{d}1\ \hat{d}2\ \ldots\ \hat{d}512]$. Each of the determiner estimates of vector $\hat{D}$ comprises one 11-bit symbol, and is associated with a respective confidence value, where the vector of confidence values is denoted by L=[L1 L2 . . . L512]. In the case where the terms of vector $\hat{D}$ are selected from one of M possible symbols, each of the confidence values of the vector L may be replaced by a confidence value vector of length M, where each element of the confidence value vector would comprise a probability value corresponding to a respective one of the M possible symbols. These 512 confidence values (or confidence value vectors) are based on the 2048×512 binary data estimates 914, and may also be based their respective confidence values (if they exist).

As noted with respect to FIG. 8, the nub 804 may undergo FEC encoding 818 at the transmitter, and the resultant FEC-encoded nub 820 may be transmitted to the receiver via a separate channel from the data set 814. The receiver may determine an estimate of the encoded nub 924 from a received signal. As noted by arrow 926, the receiver may apply FEC decoding to the encoded nub estimate 924 to recover an error-free nub 918 comprising 90 symbols, each consisting of 11 bits. The FEC decoding 926 is done in accordance with the same FEC scheme that was used for the FEC encoding 818 applied to the nub 804 at the transmitter.

The FEC decoding denoted by the arrow 906 is performed using to the same tree structure 812 illustrated in FIG. 8. In this case, the root vector is $\hat{D}$, and the confidence values L are used together with the symbols of the error-free nub 918 to decode a vector D of error-free determiners 904. The symbols of the error-free nub 918 may be provided to the appropriate leaf nodes for correcting errors in the determiner estimates 902. This process is similar to the decoding process described with respect to FIG. 5.

The initial steps of the FEC decoding will now be described in detail, focusing on the decoding at nodes 7-11. Starting with the root vector $\hat{D}$, the XOR operation 810 is applied recursively in accordance with the tree structure 812, thereby resulting in a 64-symbol vector denoted by $\hat{B}7a$ at branch node 7. The terms of $\hat{B}7a$ are initial symbol estimates that are calculated from the symbol estimates of the root vector $\hat{D}$ according to Equations 1:

$$\hat{B}7a(1)=(\hat{d}1\oplus\hat{d}2\ \ldots\ \oplus\hat{d}8)$$

$$\hat{B}7a(2)=(\hat{d}9\oplus\hat{d}10\ \ldots\ \oplus\hat{d}16)$$

. . .

$$\hat{B}7a(64)=(\hat{d}505\oplus\hat{d}506\ \ldots\ \oplus\hat{d}512). \quad [1]$$

The symbol estimates of the vector $\hat{B}7a$ may have respective confidence values denoted by $L_{\hat{B}7a}$. For example, the confidence value for $\hat{B}7a(1)$ may be calculated as $L_{\hat{B}7a}(1)=\min(L1\ \ldots\ L8)$.

The XOR operation 810 is applied to the initial symbol estimates $\hat{B}7a$ to generate a 32-symbol vector $\hat{C}11$ at leaf node 11 according to Equations 2:

$$\hat{C}11(1)=\hat{B}7a(1)\oplus\hat{B}7a(2)$$

$$\hat{C}11(2)=\hat{B}7a(3)\oplus\hat{B}7a(4)$$

. . .

$$\hat{C}11(32)=\hat{B}7a(63)\oplus\hat{B}7a(64). \quad [2]$$

The vector en may have an associated confidence value vector $L_{\hat{C}11}$, with each confidence value calculated based on a respective pair of values from the vector $L_{\hat{B}7a}$. Based on the FEC encoding performed at the transmitter, it is expected that the symbol estimates of $\hat{C}11$ should, together, form a codeword C11 of the FEC code used at leaf node 11. In this case, the FEC code is a repetition code requiring that the symbols of the codeword C11 are identical to 32 respective symbols of the error-free nub 918. Thus, the error correction at leaf node 11 may be achieved by performing a straightforward replacement of the symbol estimates of $\hat{C}11$ with the respective symbols of the error-free nub 918. As a result of the error correction, a 32-symbol error-free codeword C11 is generated at leaf node 11.

The error-free codeword C11 provides information that may be used to improve the decoding performed at other leaf nodes. For example, the error-free symbol C11(1) provides the information that $(\hat{d}1 \oplus \hat{d}2 \ldots \oplus \hat{d}8) = C11(1) \oplus (\hat{d}9 \oplus \hat{d}10 \ldots \oplus \hat{d}16)$, while the error-free symbol C11(2) provides the information that $(\hat{d}17 \oplus \hat{d}18 \ldots \oplus \hat{d}24) = C11(2) \oplus (\hat{d}25 \oplus \hat{d}26 \ldots \oplus \hat{d}32)$, and so on.

Referring again to branch node 7, the tree structure 812 dictates that the odd symbols of the node-7 vector are selected to form the vector at branch node 8. Initial estimates for the odd symbols of the node-7 vector are already provided by the vector $\hat{B}7a$. However, as a result of the error correction performed at leaf node 11, it is possible to calculate additional estimates for the odd symbols of the node-7 vector. These additional estimates are represented by $\hat{B}7b$, and may be calculated according to Equations 3:

$$\hat{B}7b(1) = C11(1) \oplus (\hat{d}9 \oplus \hat{d}10 \ldots \oplus \hat{d}16)$$

$$\hat{B}7b(3) = C11(2) \oplus (\hat{d}25 \oplus \hat{d}26 \ldots \oplus \hat{d}32)$$

...

$$\hat{B}7b(63) = C11(32) \oplus (\hat{d}505 \oplus \hat{d}506 \ldots \oplus \hat{d}512). \qquad [3]$$

The symbol estimates of the vector $\hat{B}7b$ may have respective confidence values denoted by $L_{B7b}$. For example, the confidence value for $\hat{B}7b(1)$ may be calculated as $L_{B7b}(1) = \min(L9 \ldots L16)$. Thus, for each odd symbol of the node-7 vector, there are now two estimates. The odd estimates of $\hat{B}7a$ may be combined with the respective odd estimates of $\hat{B}7b$ to generate a single vector $\hat{B}7$, with respective confidence values denoted by a vector $L_{B7}$, where the odd estimates of $\hat{B}7$ are to be used at branch node 8. For example, the estimates $\hat{B}7a(1)$ and $\hat{B}7b(1)$ may be combined to generate an estimate $\hat{B}7(1)$ having a confidence value $L_{B7}(1)$, where the precise nature of the combination depends on the values of $\hat{B}7a(1)$ and $\hat{B}7b(1)$ and the values of $L_{B7a}(1)$ and $L_{B7b}(1)$, as described previously with respect to FIG. 5. In general, each symbol estimate of the vector $\hat{B}7$ is based on certain values of the vector $\hat{D}$ as well as certain values of the error-free codeword C11.

Referring now to branch node 8, a vector $\hat{B}8a$ of initial symbol estimates is calculated by selecting the odd symbols of the vector $\hat{B}7$, according to Equations 4:

$$\hat{B}8a(1) = \hat{B}7(1)$$

$$\hat{B}8a(2) = \hat{B}7(3)$$

...

$$\hat{B}8a(32) = \hat{B}7(63). \qquad [4]$$

The initial symbol estimates of the vector $\hat{B}8a$ may have respective confidence values denoted by $L_{B8a}$, which are equal to the odd values of $L_{B7}$. The XOR operation 810 is applied to the initial symbol estimates of $\hat{B}8a$ to generate a 16-symbol vector $\hat{C}10$ at leaf node 10, according to Equations 5:

$$\hat{C}10(1) = \hat{B}8a(1) \oplus \hat{B}8a(2)$$

$$\hat{C}10(2) = \hat{B}8a(3) \oplus \hat{B}8a(4)$$

...

$$\hat{C}10(16) = \hat{B}8a(31) \oplus \hat{B}8a(32). \qquad [5]$$

The vector $\hat{C}10$ may have an associated confidence value vector $L_{C10}$, with each confidence value calculated based on a respective pair of values from the vector $L_{B8a}$. Based on the FEC encoding performed at the transmitter, it is expected that the symbol estimates of $\hat{C}10$ should, together, form a codeword C10 of the FEC code used at leaf node 10. In this case, the FEC code is a RS code that attempts to correct errors in the 16 symbol estimates of $\hat{C}10$ using 11 symbols of the error-free nub 918, where those 11 symbols are the same 11 symbols that were generated at leaf node 10 during the FEC encoding at the transmitter. In the event that the symbol estimates of $\hat{C}10$ are not identical to the symbols of the codeword C10, the appropriate confidence values may be used in an attempt to correct errors, thereby resulting in a 16-symbol error-free codeword C10 at the leaf node 10.

The error-free codeword C10 provides information that may be used to improve the decoding performed at other leaf nodes. For example, the error-free symbol C10(1) provides the information that $(\hat{d}1 \oplus \hat{d}2 \ldots \oplus \hat{d}8) = C10(1) \oplus (\hat{d}17 \oplus \hat{d}18 \ldots \oplus \hat{d}24)$, while the error-free symbol C10(2) provides the information that $(\hat{d}33 \oplus \hat{d}34 \ldots \oplus \hat{d}40) = C10(2) \oplus (\hat{d}49 \oplus \hat{d}50 \ldots \oplus \hat{d}56)$, and so on.

Referring again to branch node 8, the tree structure 812 dictates that the odd symbols of the node-8 vector are selected to form the vector at leaf node 9. Initial estimates for the odd symbols of the node-8 vector are already provided by $\hat{B}8a$. However, as a result of the error-correction performed at leaf node 10, it is possible to calculate additional estimates for the odd symbols of the node-8 vector. These additional estimates are represented by $\hat{B}8b$, and may be calculated according to Equations 6:

$$\hat{B}8b(1) = C10(1) \oplus (\hat{d}17 \oplus \hat{d}18 \ldots \oplus \hat{d}24)$$

$$\hat{B}8b(3) = C10(2) \oplus (\hat{d}49 \oplus \hat{d}50 \ldots \oplus \hat{d}56)$$

...

$$\hat{B}8b(31) = C10(16) \oplus (\hat{d}497 \oplus \hat{d}498 \ldots \hat{d}504). \qquad [6]$$

The symbol estimates of the vector $\hat{B}8b$ may have respective confidence values denoted by $L_{B8b}$. For example, the confidence value for $\hat{B}8b(1)$ may be calculated as $L_{B8b}(1) = \min(L17 \ldots L24)$. Thus, for each odd symbol of the node-8 vector, there are now two estimates. The odd estimates of $\hat{B}8a$ may be combined with the respective odd estimates of $\hat{B}8b$ to generate a single vector $\hat{B}8$, with respective confidence values denoted by a vector $L_{B8}$, where the odd estimates of $\hat{B}8$ are to be used at leaf node 9. For example, the estimates $\hat{B}8a(1)$ and $\hat{B}8b(1)$ may be combined to generate an estimate $\hat{B}8(1)$, having a confidence value $L_{B8}(1)$, where the precise nature of the combination depends on the values of $\hat{B}8a(1)$ and $\hat{B}8b(1)$ and the values of $L_{B8a}(1)$ and $L_{B8b}(1)$, as described previously with respect to FIG. 5. In general, each symbol estimate of the vector $\hat{B}8$ is based on certain values of the vector $\hat{D}$ as well as certain values of the error-free codewords C11 and C10.

Referring now to leaf node 9, a 16-symbol vector $\hat{C}9$ is calculated by selecting the odd symbols of the vector $\hat{B}8$, according to Equations 7:

$\hat{C}9(1)=\hat{B}8(1)$ $\hat{C}9(2)=\hat{B}8(3)$

. . .

$\hat{C}9(16)=\hat{B}8(31).$  [7]

The vector $\hat{C}9$ may have an associated confidence value vector $L_{\hat{C}9}$, which in this case comprises the odd values of the vector $L_{B8}$. Based on the FEC encoding performed at the transmitter, it is expected that the symbol estimates of $\hat{C}9$ should, together, form a codeword C9 of the FEC code used at leaf node 9. In this case, the FEC code is a RS code that attempts to correct errors in the 16 symbol estimates of $\hat{C}9$ using 7 symbols of the error-free nub 918, where those 7 symbols are the same 7 symbols that were generated at leaf node 9 during the FEC encoding at the transmitter. In the event that the symbol estimates of $\hat{C}9$ are not identical to the symbols of the codeword C9, the appropriate confidence values may be used in an attempt to correct errors, thereby resulting in a 16-symbol error-free codeword C9 at the leaf node 9.

The error-free codeword C9 provides information that may be used to improve the decoding performed at other leaf nodes. For example, the error-free symbol C9(1) provides the information that $C9(1)=(\hat{d}1\oplus \hat{d}2 \ldots \hat{d}8)$, while the error-free symbol C9(2) provides the information that $C9(2)=(\hat{d}33\oplus \hat{d}34 \ldots \hat{d}40)$, and so on.

The error-free information gleaned from leaf node 9 may be combined with the error-free information gleaned from leaf node 10 to determine the error-free vector B8 at node 8, according to Equations 8:

$B8(1)=C9(1)$ $B8(2)=C9(1)\oplus C10(1)$ $B8(3)=C9(2)$

. . .

$B8(32)=C9(16)\oplus C10(16)$  [8]

When the information provided by the error-free vector B8 is combined with the information provided by leaf node 11, it is possible to calculate the error-free vector B7 at node 7, according to Equations 9:

$B7(1)=C9(1)$ $B7(2)=C9(1)\oplus C11(1)$ $B7(3)=C9(1)\oplus C10(1)$ $B7(4)=C9(1)\oplus C10(1)\oplus C11(2)$

. . .

$B7(64)=C9(16)\oplus C10(16)\oplus C11(32).$  [9]

In this manner, the decoding performed at nodes 7-11 has generated the error-free vectors C11, C10, C9, B8, and B7. The remaining nodes of the tree structure 812 may be decoded in a similar manner using this sequential decoding process. That is, the error-free vector B7 may be used to generate a 128-symbol vector $\hat{B}5$ at node 5, which is dependent on certain values of the vector $\hat{D}$ as well as the error-free codewords C11, C10, and C9. The vector $\hat{B}5$ may then be used to calculate a 64-symbol vector $\hat{C}6$ at leaf node 6. According to the code RS(64,17), 17 symbols of the error-free nub 918 are used in an attempt to correct errors in $\hat{C}6$, thereby generating the error-free codeword C6. The information provided by leaf node 6 may then be used to determine the error-free vector B5 at node 5. The vector B5 may be used to generate a 256-symbol vector $\hat{B}3$ at node 3, which is dependent on certain values of the vector $\hat{D}$ as well as the error-free codewords C11, C10, C9, and C6. The vector $\hat{B}3$ may then be used to calculate a 128-symbol vector $\hat{C}4$ at leaf node 4. According to the code RS(128,13), 13 symbols of the error-free nub 918 are used in an attempt to correct errors in $\hat{C}4$, thereby generating the error-free codeword C4. The information provided by leaf node 4 may then be used to determine the error-free vector B3 at node 3. The vector B3 may be used to generate a 512-symbol vector at the root node, which is dependent on the values of the vector $\hat{D}$ as well as the error-free codewords C11, C10, C9, C6, and C4. This vector of symbol estimates, which benefits from the error-correction performed at leaf nodes 11, 10, 9, 6, and 4, may then be used to calculate a 256-symbol vector $\hat{C}2$ at leaf node 2. According to the code RS(256,10), 10 symbols of the error-free nub 918 are used in an attempt to correct errors in $\hat{C}2$, thereby generating the error-free codeword C2. The information provided by leaf node 2 may then be used to determine the error-free vector D.

Where all the errors have been corrected, the vector 904 output by the FEC decoding 906 is identical to the determiners 802 calculated at the transmitter. The values of the error-free determiners 904 may then be used in an attempt to correct errors in the data estimates 914, as denoted by the arrow 916, thereby resulting in an error-free data set 922. For example, as described in more detail in U.S. Pat. No. 10,615,913, the receiver may calculate the difference between each error-free determiner 904 and the respective determiner estimate 902, thereby generating a respective error syndrome. From each non-zero error-syndrome, it may be possible to determine the location of at least one error within a corresponding data vector estimate. Where all errors in the data estimates 914 have been corrected, the error-free data set 922 is identical to the data set 814 transmitted by the transmitter.

Similarly to the tree structure 412, the structure 812 may cause noise to become more concentrated at some leaf nodes than other leaf nodes. For example, due to the recursive application of the operation 810, the initial estimate of the vector at node 11 may suffer from more noise than the initial estimate of the vector at node 2. Leaf nodes with higher concentrations of noise may be assigned lower-rate FEC codes comprising higher concentrations of parity, such that errors arising from the higher noise may be corrected. For example, since the codeword C11 has a higher concentration of noise than the codeword C2, the codeword C11 also comprises a higher concentration of parity. In other words, a stronger FEC code is used at leaf node 11 than at leaf node 2. According some examples, leaf nodes with stronger FEC codes may be decoded prior to leaf nodes with weaker FEC codes. The error-free information obtained from the leaf nodes with the stronger FEC codes may be used to assist with the decoding at leaf nodes with weaker FEC codes.

Figure 10:
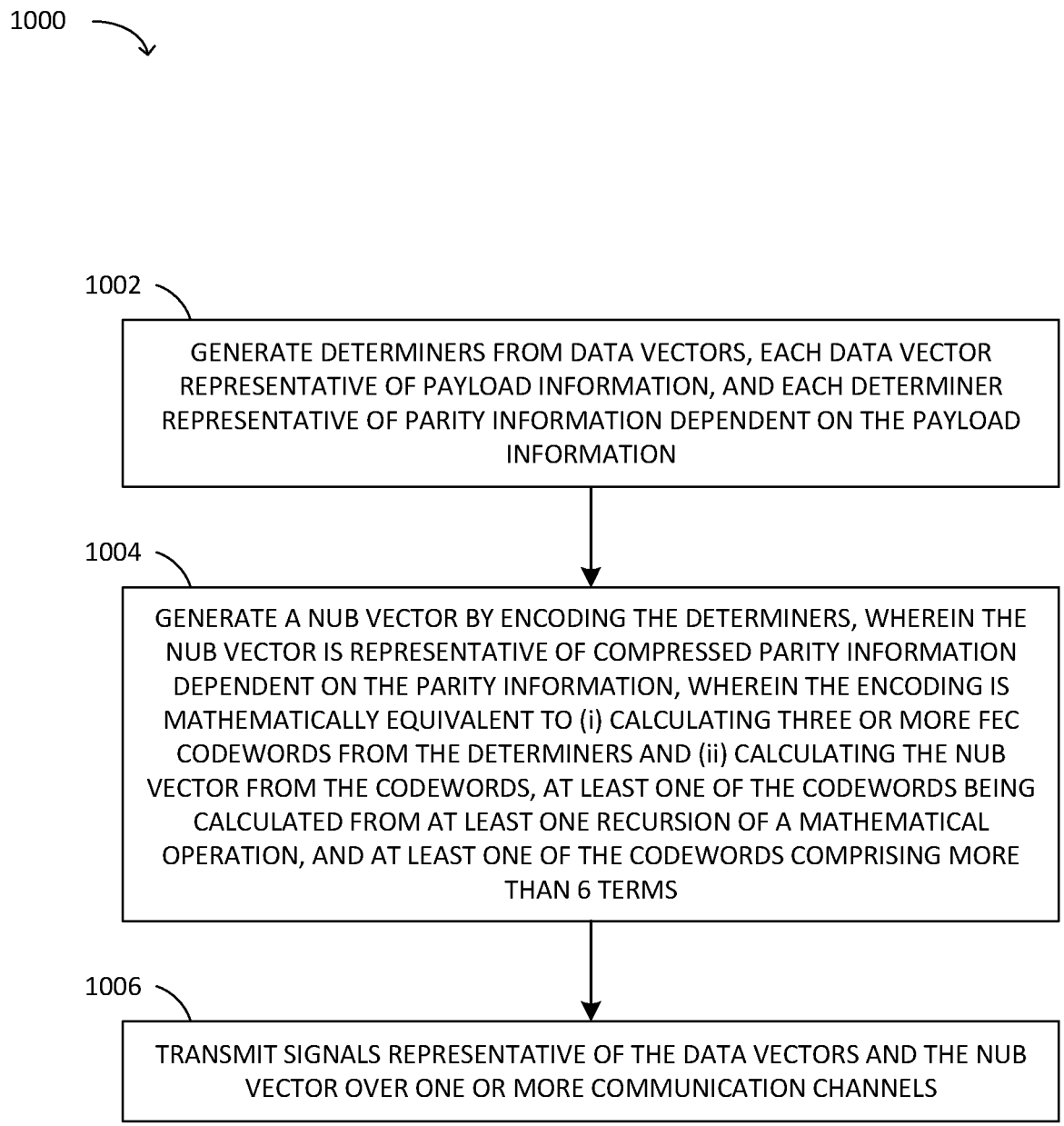
FIG. 10 illustrates an example method for compression FEC encoding accordance with some examples of the technology disclosed herein.

FIG. 10 illustrates an example method 1000 for compression FEC encoding using a tree structure in accordance with some examples of the technology disclosed herein. The method 1000 may be performed at a transmitter device, such as the transmitter device 102 or 200.

At 1002, the transmitter device generates determiners from data vectors, where each data vector is representative of payload information, and where each determiner is representative of parity information dependent on the payload information. The data vectors may be made up of terms comprising bits or symbols, such as the bits 202 described with respect to FIG. 2. The determiners are representative of parity information that is dependent on the payload information. Each determiner is calculated as a function of a respective one of the data vectors, and may be made up of terms comprising bits or symbols. According to one example, the data vectors comprise the 512 vectors of the data set 814, and the determiners comprise the 512 determiners of the vector 802, as described with respect to FIG. 8.

At 1004, the transmitter device generates a nub vector by encoding the determiners. The nub vector is representative of compressed parity information that is dependent on the parity information represented by the determiners. The nub vector may be made up of terms comprising bits or symbols. The nub vector 804 is one example of a nub vector.

The encoding at 1004 is mathematically equivalent to calculating a plurality of FEC codewords from the determiners and then calculating the nub vector from the codewords. According to some examples, the plurality of codewords may comprise three or more codewords. Examples of the codewords include the codewords C2, C4, C6, C9, C10, and C11, which are equal to the vectors at leaf nodes 2, 4, 6, 9, 10, and 11, respectively, in FIG. 8. As described with respect to FIG. 8, the encoding 806 is mathematically equivalent to the encoding operations implemented in the tree structure 812, which include calculating four branch vectors and six leaf vectors from the determiners 802, and then using the six leaf vectors (which are codewords of various FEC codes) to calculate the terms of the nub vector 804.

According to some examples, each codeword calculated at 1002 belongs to a different FEC code. According to other examples, two or more of the codewords calculated at 1002 may belong to the same FEC code. According to some examples, the codewords calculated at 1002 may belong to at least two different FEC codes of different rates. For example, as described with respect to FIG. 8, the FEC code for which C2 is a codeword has a higher rate than the FEC code for which C11 is a codeword.

According to some examples, the FEC codes used for encoding may comprise any combination of BCH codes, shortened binary BCH codes, RS codes, Reed-Muller codes, and repetition codes.

According to some examples, at least one of the codewords is calculated from at least one recursion of a mathematical operation. For example, the codeword C11 is calculated from a third recursion, at node 7, of the XOR operation 810, where the initial application of the XOR operation 810 was at node 1, the first recursion was at node 3, and the second recursion was at node 5.

According to some examples, at least one of the codewords comprises more than 6 terms. According to some examples, at least one of the codewords comprises more than 14 terms. According to some examples, at least one of the codewords comprises more than 30 terms.

According to some examples, the encoding performed at 1002 may be implemented using the recursive application of mathematical operations, for example, as described with respect to FIG. 8. According to other examples, the encoding performed at 1002 may be implemented by multiplying the determiners with a unique matrix in hardware at the transmitter device to generate the nub vector, where the matrix multiplication is mathematically or functionally equivalent to the recursive application of the mathematical operations.

Once the nub vector is generated at 1002, the transmitter device may transmit signals representative of the data vectors and the nub vector over one or more communication channels, such as the communication channel 106. For example, the signals may comprise optical signals, such as the signal 204, which has been modulated based on the data vectors and the nub vector. The signals may be transmitted to a receiver device, such as the receiver device 104 or 300.

According to some examples, the nub vector may be encoded using a different encoding scheme than the one used to encode the determiners. In this case, the signals transmitted at 1006 may include signals representative of the encoded nub (including nub parity information calculated using the different encoding scheme).

Figure 11:
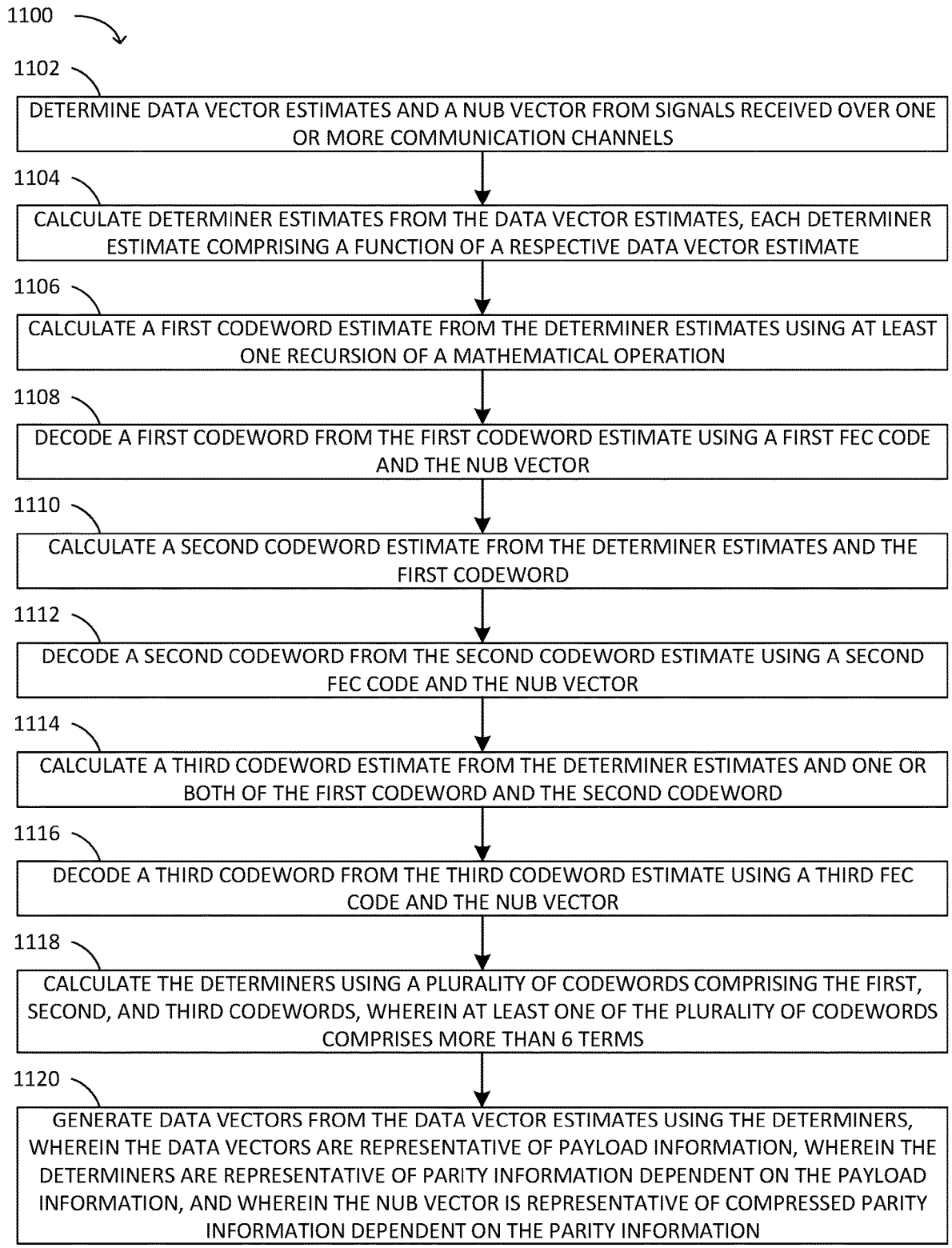
FIG. 11 illustrates an example method for compression FEC decoding accordance with some examples of the technology disclosed herein.

FIG. 11 illustrates an example method 1100 for compression FEC decoding using a tree structure in accordance with some examples of the technology disclosed herein. The method 1100 may be performed at a receiver device, such as the receiver device 104 or 300.

At 1102, the receiver device determines data vector estimates and a nub vector from signals received at the receiver device over one or more communication channels. The data vector estimates may be made up of terms comprising bits or symbols. Examples of the data vector estimates include the bits 340 described with respect to FIG. 3, and the data vector estimates 914 described with respect to FIG. 9. According to some examples, each term of a data vector estimate may comprise or be associated with a respective confidence value. The nub vector may be made up of terms comprising bits or symbols. Determination of the nub vector may comprise decoding an encoded version of the nub vector, where the decoding is based on an encoding scheme used to encode the nub vector at the transmitter device. According to some examples, a signal representing the nub vector may be received over a separate communication channel from a signal representing the data vector estimates. The 90-symbol nub vector 918 is one example of the nub vector determined at 1102.

At 1104, the receiver device calculates determiner estimates from the data vector estimates. Each determiner estimate is calculated as a function of a respective one of the data vector estimates, and may be made up of terms comprising bits or symbols. According to one example, the determiner estimates comprise the 512 determiner estimates of the vector $\hat{D}$ 902, as described with respect to FIG. 9. According to some examples, each term of a determiner estimate may comprise or be associated with a respective confidence value.

Steps 1106-1118 of method 1100 comprise steps for decoding the determiner estimates in order to generate determiners.

At 1106, the receiver device calculates a first codeword estimate from the determiner estimates using at least one recursion of a mathematical operation. For example, the codeword estimate $\hat{C}11$ at leaf node 11 is calculated from a third recursion, at node 7, of the XOR operation 810 (where the initial application of the XOR operation 810 was at node 1, the first recursion was at node 3, and the second recursion was at node 5).

At 1108, the receiver device decodes a first codeword from the first codeword estimate calculated at 1106 using a first FEC code and the nub vector. For example, the error-free codeword C11 is generated by decoding the codeword estimate $\hat{C}11$ using the FEC code associated with leaf node 11. In this case, the FEC code at node 11 is a repetition code requiring that the symbols of the codeword C11 are identical to 32 respective symbols of the error-free nub 918. As described previously, in this particular example, the codeword C11 is decoded simply by replacing the terms of the codeword estimate $\hat{C}11$ with appropriate terms of the nub vector 918. However, according to other examples, the first codeword estimate may comprise or be associated with confidence values, and the decoding of the first codeword may be based, in part, on those confidence values.

At 1110, the receiver device calculates a second codeword estimate using the determiner estimates and the first codeword decoded at 1106. For example, as previously described, an initial vector estimate $\hat{B}7a$ at branch node 7 is calculated by applying the XOR operation 810 recursively to terms of the determiner estimates D. However, as a result of the decoding performed at leaf node 11, an additional vector estimate B7b is generated at branch node 7, which is based on terms of the determiner estimates $\hat{D}$ as well as the codeword C11 (see Equations 3). The estimates $\hat{B}7a$ and B7b are combined to generate an estimate B7, from which the codeword estimate $\hat{C}10$ is ultimately calculated. Accordingly, the codeword estimate $\hat{C}10$ is an example of a second codeword estimate being calculated using the determiner estimates (i.e., terms of $\hat{D}$) and the first codeword (i.e., C11).

At 1112, the receiver device decodes a second codeword from the second codeword estimate calculated at 1110 using a second FEC code and the nub vector. For example, the error-free codeword C10 is generated by decoding the codeword estimate $\hat{C}10$ using the FEC code associated with leaf node 10. In this case, the FEC code is a RS code that uses 11 symbols of the nub vector in an attempt to correct errors in $\hat{C}10$. According to some examples, the second codeword estimate may comprise or be associated with confidence values, and the decoding of the second codeword may be based, in part, on those confidence values, as described previously.

At 1114, the receiver device calculates a third codeword estimate using the determiner estimates and either one or both of the first codeword decoded at 1108 and the second codeword decoded at 1112. For example, as previously described, as a result of the decoding performed at leaf nodes 11 and 10, two estimates $\hat{B}8a$ and $\hat{B}8b$ are generated for the vector at branch node 8, where the terms of $\hat{B}8a$ are based on terms of the determiner estimates $\hat{D}$ as well as the codeword C11 (see Equations 3 and 4), and where the terms of $\hat{B}8b$ are based on terms of the determiner estimates $\hat{D}$ as well as the codeword C10 (see Equations 6). The estimates $\hat{B}8a$ and $\hat{B}8b$ are combined to generate an estimate $\hat{B}8$ from which the codeword estimate $\hat{C}9$ is ultimately calculated. Accordingly, the codeword estimate $\hat{C}9$ is an example of a third codeword estimate being calculated using the determiner estimates (i.e., terms of $\hat{D}$), the first codeword (i.e., C11), and the second codeword (i.e., C10).

At 1116, the receiver device decodes a third codeword from the third codeword estimate calculated at 1114 using a third FEC code and the nub vector. For example, the error-free codeword C9 is generated by decoding the codeword estimate $\hat{C}9$ using the FEC code associated with leaf node 9. In this case, the FEC code is a RS code that uses 7 symbols of the nub vector in an attempt to correct errors in $\hat{C}9$. According to some examples, the third codeword estimate may comprise or be associated with confidence values, and the decoding of the third codeword may be based, in part, on those confidence values, as described previously.

Although not explicitly illustrated in FIG. 11, steps 1114-1116 may be repeated for each additional codeword estimate that is calculated and decoded. According to some examples, one or more codewords that are decoded earlier in the decoding method 1100 may be used to enhance the estimates of one or more codewords that are to be decoded later in the decoding method 1100.

According to some examples, at least one of the codewords comprises more than 6 terms. According to some examples, at least one of the codewords comprises more than 14 terms. According to some examples, at least one of the codewords comprises more than 30 terms.

According to some examples, the FEC codes used in the method 1100, such as the first, second, and third FEC codes, may comprise two or more different FEC codes having different FEC rates. For example, the first FEC code may have a lower rate than the second FEC code, and/or the second FEC code may have a lower rate than the third FEC code. According to some examples, the FEC codes may comprise any combination of BCH codes, shortened binary BCH codes, RS codes, Reed-Muller codes, and repetition codes.

At 1118, the receiver device calculates the determiners using the first, second, and third codewords decoded at 1108, 1112, and 1116, respectively. The 512 determiners comprised in the vector D 904 represent one example of the determiners calculated 1118. Each determiner may be made up of terms comprising bits or symbols.

At 1120, the receiver device generates data vectors from the data vector estimates using the determiners, where the data vectors are representative of payload information, where the determiners are representative of parity information dependent on the payload information, and where the nub vector is representative of compressed parity information dependent on the parity information represented by the determiners. For example, the determiners calculated at 1118 may be used by comparing them to the determiner estimates generated at 1104 to calculate error syndromes. The error syndromes may be used in an attempt to correct errors in the data vector estimates 914, thereby resulting in the error-free data set 922.

In the examples described herein, FEC encoding and decoding is performed according to a tree structure. The FEC encoding is mathematically equivalent to calculating a plurality of codewords from a root vector, where each codeword satisfies a constraint of a FEC code. At least one of the codewords is calculated using a recursive mathematical operation. According to some examples, at least one of the codewords comprises more than 6 terms. Encoding techniques that are functionally equivalent to recursive operations, such as those described herein, may be implemented in hardware with limited complexity. Decoding hardware may advantageously follow some or all of the recursive tree structure, or may be functionally equivalent with other physical layouts.

The scope of the claims should not be limited by the details set forth in the examples, but should be given the broadest interpretation consistent with the description as a whole.

What is claimed is:

1. A method performed at a transmitter device, the method comprising:
  generating an encoded vector by encoding a data vector representative of payload information, wherein the encoded vector is representative of the payload information and parity information dependent on the payload information, and wherein the encoding is mathematically equivalent to (i) calculating three or more forward error correction (FEC) codewords from the data vector and (ii) calculating the encoded vector from the three or more codewords, at least one of the codewords being calculated from at least one recursion of a mathematical operation implemented according to a tree structure, and at least one of the codewords comprising more than 6 terms; and transmitting a signal representative of the encoded vector over a communication channel.

2. The method as claimed in claim 1, wherein the mathematical operation comprises Galois Field addition.

3. The method as claimed in claim 2, wherein the mathematical operation comprises an exclusive OR operation.

4. The method as claimed in claim 1, wherein the terms comprise bits or symbols.

5. The method as claimed in claim 1, wherein each codeword belongs to of one of a plurality of FEC codes comprising Bose, Chaudhuri, and Hocquenghem (BCH) codes, shortened binary BCH codes, Reed-Solomon (RS) codes, Reed-Muller codes, and repetition codes.

6. The method as claimed in claim 1, wherein each codeword belongs to a systematic FEC code.

7. The method as claimed in claim 1, further comprising calculating the encoded vector by applying a matrix to the data vector.

8. A method performed at a receiver device, the method comprising:
    determining, from a signal received at the receiver device over a communication channel, a vector estimate representative of payload information and parity information dependent on the payload information;
    generating a data vector representative of the payload information by decoding the vector estimate, wherein the decoding comprises
        calculating a first codeword estimate from the vector estimate using at least one recursion of a mathematical operation;
        decoding a first codeword from the first codeword estimate using a first forward error correction (FEC) code;
        calculating a second codeword estimate using the vector estimate and the first codeword;
        decoding a second codeword from the second codeword estimate using a second FEC code;
        calculating a third codeword estimate using the vector estimate and one or both of the first codeword and the second codeword;
        decoding a third codeword from the third codeword estimate using a third FEC code; and
        calculating the data vector using a plurality of codewords comprising the first, second, and third codewords,
    wherein at least one of the plurality of codewords comprises more than 6 terms.

9. The method as claimed in claim 8, wherein the mathematical operation comprises Galois Field addition.

10. The method as claimed in claim 9, wherein the mathematical operation comprises an exclusive OR operation.

11. The method as claimed in claim 8, wherein the terms comprise bits or symbols.

12. The method as claimed in claim 8, wherein the FEC codes comprise any combination of Bose, Chaudhuri, and Hocquenghem (BCH) codes, shortened binary BCH codes, Reed-Solomon (RS) codes, Reed-Muller codes, and repetition codes.

13. The method as claimed in claim 8, wherein the FEC codes comprise systematic codes.

14. The method as claimed in claim 8, wherein the codeword estimates comprise confidence values, and wherein the first, second, and third codewords are decoded based, in part, on the confidence values.

15. A receiver device comprising:
    circuitry configured to determine, from a signal received at the receiver device over a communication channel, a vector estimate representative of payload information and parity information dependent on the payload information;
    circuitry configured to generate a data vector representative of the payload information by decoding the vector estimate, wherein the decoding comprises
        calculating a first codeword estimate from the vector estimate using at least one recursion of a mathematical operation;
        decoding a first codeword from the first codeword estimate using a first forward error correction (FEC) code;
        calculating a second codeword estimate using the vector estimate and the first codeword;
        decoding a second codeword from the second codeword estimate using a second FEC code;
        calculating a third codeword estimate using the vector estimate and one or both of the first codeword and the second codeword;
        decoding a third codeword from the third codeword estimate using a third FEC code; and
        calculating the data vector using a plurality of codewords comprising the first, second, and third codewords,
    wherein at least one of the plurality of codewords comprises more than 6 terms.

16. The receiver device as claimed in claim 15, wherein the mathematical operation comprises Galois Field addition.

17. The receiver device as claimed in claim 16, wherein the mathematical operation comprises an exclusive OR operation.

18. The receiver device as claimed in claim 15, wherein the FEC codes comprise any combination of Bose, Chaudhuri, and Hocquenghem (BCH) codes, shortened binary BCH codes, Reed-Solomon (RS) codes, Reed-Muller codes, and repetition codes.

19. The receiver device as claimed in claim 15, wherein the FEC codes comprise systematic codes.

20. The receiver device as claimed in claim 15, wherein the codeword estimates comprise confidence values, and wherein the first, second, and third codewords are decoded based, in part, on the confidence values.

* * * * *